US012783171B2

(12) United States Patent
Harada

(10) Patent No.: US 12,783,171 B2
(45) Date of Patent: Nov. 3, 2026

(54) SEMICONDUCTOR MEMORY DEVICE

(71) Applicant: Kioxia Corporation, Tokyo (JP)

(72) Inventor: Yoshikazu Harada, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 158 days.

(21) Appl. No.: 18/799,669

(22) Filed: Aug. 9, 2024

(65) Prior Publication Data

US 2024/0402947 A1 Dec. 5, 2024

Related U.S. Application Data

(63) Continuation of application No. 17/952,402, filed on Sep. 26, 2022, now Pat. No. 12,086,465, which is a (Continued)

(30) Foreign Application Priority Data

Apr. 27, 2020 (JP) ................................ 2020-078348

(51) Int. Cl.

| | |
|---|---|
| ***G06F 12/00*** | (2006.01) |
| ***G06F 3/06*** | (2006.01) |
| ***G11C 16/10*** | (2006.01) |
| ***G11C 16/26*** | (2006.01) |
| *G11C 16/04* | (2006.01) |

(Continued)

(52) U.S. Cl.

CPC .......... *G06F 3/0659* (2013.01); *G06F 3/0604* (2013.01); *G06F 3/0673* (2013.01); *G11C 16/10* (2013.01); *G11C 16/26* (2013.01); *G11C 16/0483* (2013.01); *G11C 16/08* (2013.01); *G11C 16/14* (2013.01); *G11C 16/30* (2013.01)

(58) Field of Classification Search

CPC .... G06F 3/0659; G06F 3/0604; G06F 3/0673; G11C 16/10; G11C 16/25; G11C 16/0483; G11C 16/08; G11C 16/014; G11C 16/30

See application file for complete search history.

(56) References Cited

U.S. PATENT DOCUMENTS

| | | | |
|---|---|---|---|
| 9,093,132 | B2 | 7/2015 | Kim et al. |
| 10,249,377 | B2 | 4/2019 | Kasai et al. |

(Continued)

FOREIGN PATENT DOCUMENTS

| | | | |
|---|---|---|---|
| JP | 2014186787 | A | 10/2014 |
| JP | 2019029045 | A | 2/2019 |

(Continued)

OTHER PUBLICATIONS

Notice of Allowance dated Jun. 27, 2022, issued in U.S. Appl. No. 17/184,674.

(Continued)

*Primary Examiner* — Min Huang

(74) *Attorney, Agent, or Firm* — Holtz, Holtz & Volek PC

(57) ABSTRACT

A semiconductor memory device includes a memory cell array and a control circuit configured to receive a first command set, reject a second command set related to a write operation or an erase operation, in a first time period of executing a first operation on the memory cell array in response to the first command set, receive a third command set related to a read operation in the first time period, and execute the read operation on the memory cell array in response to the third command set.

20 Claims, 25 Drawing Sheets

Related U.S. Application Data continuation of application No. 17/184,674, filed on Feb. 25, 2021, now Pat. No. 11,487,476.

(51) Int. Cl.

| | |
|---|---|
| *G11C 16/08* | (2006.01) |
| *G11C 16/14* | (2006.01) |
| *G11C 16/30* | (2006.01) |

(56) References Cited

U.S. PATENT DOCUMENTS

| | | | | |
|---|---|---|---|---|
| 11,487,476 | B2 * | 11/2022 | Harada | G11C 16/10 |
| 12,086,465 | B2 * | 9/2024 | Harada | G11C 16/10 |
| 2006/0221681 | A1 | 10/2006 | Misumi et al. | |
| 2009/0089482 | A1 * | 4/2009 | Traister | G06F 12/0246 711/E12.001 |
| 2009/0089492 | A1 | 4/2009 | Yoon et al. | |
| 2010/0277968 | A1 * | 11/2010 | Tokiwa | G11C 13/0002 365/236 |
| 2014/0269097 | A1 | 9/2014 | Kaga et al. | |
| 2016/0012902 | A1 | 1/2016 | Harada et al. | |
| 2018/0150252 | A1 | 5/2018 | Lewis et al. | |
| 2018/0211708 | A1 | 7/2018 | Igahara et al. | |
| 2019/0080773 | A1 | 3/2019 | Kondo | |
| 2020/0161320 | A1 | 5/2020 | Yamaguchi | |
| 2020/0210098 | A1 * | 7/2020 | Simionescu | G06F 3/0655 |
| 2021/0035646 | A1 | 2/2021 | Harada | |
| 2021/0334044 | A1 | 10/2021 | Harada | |

FOREIGN PATENT DOCUMENTS

| | | |
|---|---|---|
| JP | 2019053795 A | 4/2019 |
| JP | 2021022414 | 2/2021 |

OTHER PUBLICATIONS

Office Action (Non-Final Rejection) dated Mar. 18, 2022, issued in U.S. Appl. No. 17/184,674.

* cited by examiner

| Page | Data | | | |
|---|---|---|---|---|
| Upper | 1 | 0 | 0 | 1 |
| Lower | 1 | 1 | 0 | 0 |

| DQ7 | DQ6 | DQ5 | DQ4 | DQ3 | DQ2 | DQ1 | DQ0 |
|---|---|---|---|---|---|---|---|
| ... | Busy"0"<br>Ready"1" | ... | Reserved | RR Busy"0"<br>RR Ready"1" | Reserved | ... | Pass"0"<br>Fail"1" |

FIG. 6

SEMICONDUCTOR MEMORY DEVICE

CROSS-REFERENCE TO RELATED APPLICATIONS

This application is a Continuation application of U.S. application Ser. No. 17/952,402, filed on Sep. 26, 2022, which is a Continuation application of U.S. application Ser. No. 17/184,674, filed on Feb. 25, 2021, and issued as U.S. Pat. No. 11,487,476 on Nov. 1, 2022, which is based upon and claims the benefit of priority from Japanese Patent Application No. 2020-078348, filed Apr. 27, 2020, the entire contents of all of which are incorporated herein by reference.

FIELD

Embodiments described herein relate generally to a semiconductor memory device.

BACKGROUND

As a semiconductor memory device, a NAND flash memory is known.

BRIEF DESCRIPTION OF THE DRAWINGS

FIG. 6 shows an example of the definition of status information used by the semiconductor memory device according to the first embodiment.

DETAILED DESCRIPTION

In general, according to an embodiment, a semiconductor memory device includes a memory cell array and a control circuit. The control circuit is configured to receive a first command set, receive a second command set related to a read operation while rejecting a command set related to a write operation or erase operation in response to the first command set, and execute the read operation on the memory cell array in response to the second command set.

Hereinafter, embodiments will be described with reference to the accompanying drawings. In the following description, constituent elements having the same function and configuration will be assigned a common reference symbol. When multiple constituent elements with a common reference symbol need to be distinguished from one another, suffixes are added after the common reference symbol for distinction. When the constituent elements need not be particularly distinguished from one another, the constituent elements are assigned only the common reference symbol without suffixes.

Each function block can be implemented in the form of hardware, software, or a combination thereof. The function blocks need not necessarily be distinguished from one another as described below. For example, a function may be partly executed by a function block different from the function block described as an example. In addition, the function block described as an example may be divided into smaller function sub-blocks.

First Embodiment

Hereinafter, a semiconductor memory device 1 according to a first embodiment will be described.

Configuration Example (1) Memory System

Figure 1:
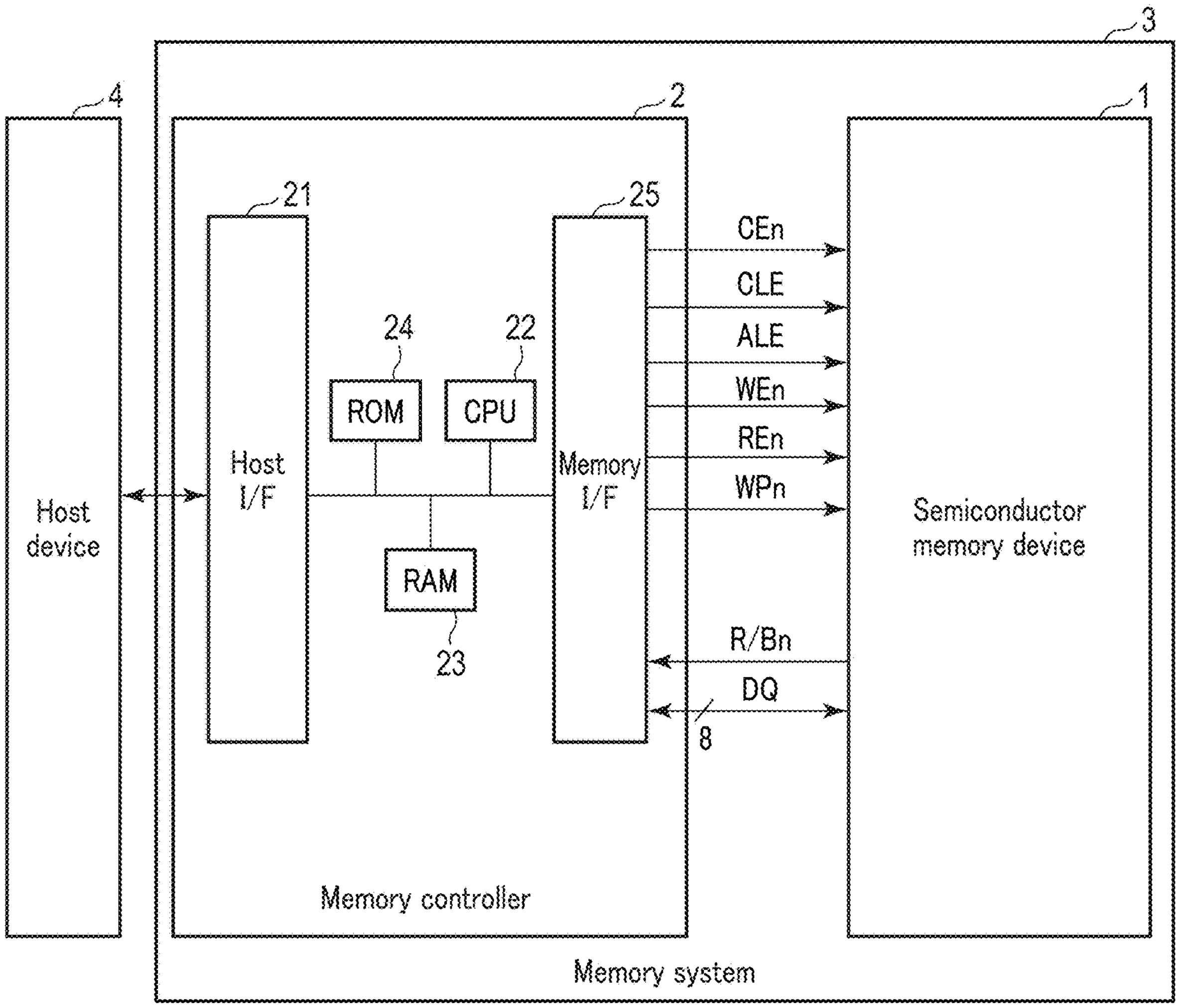
FIG. 1 is a block diagram showing an example of the configuration of a memory system including a semiconductor memory device according to a first embodiment.

FIG. 1 is a block diagram showing an example of the configuration of a memory system 3 including the semiconductor memory device 1 according to the first embodiment.

The memory system 3 includes a memory controller 2, as well as the semiconductor memory device 1, and is controlled by a host device 4. The memory system 3 is, for example, a solid state drive (SSD) or an SD (registered trademark) card.

The semiconductor memory device 1 is controlled by the memory controller 2. The memory controller 2 receives a host command from the host device 4, and controls the semiconductor memory device 1 based on the received host command.

The memory controller 2 includes a host interface circuit 21, a central processing unit (CPU) 22, a random access memory (RAM) 23, a read only memory (ROM) 24, and a memory interface circuit 25. The memory controller 2 is configured as, for example, a system-on-a-chip (SoC).

The ROM 24 stores firmware (a program). The RAM 23 can retain the firmware and is used as a work area of the CPU 22. The RAM 23 also temporarily retains data and functions as a buffer and a cache. The firmware stored in the ROM 24 and loaded into the RAM 23 is executed by the CPU 22. The memory controller 2 thereby executes various operations including a write operation, a read operation, and the like, as well as some functions of the host interface circuit 21 and the memory interface circuit 25.

The host interface circuit 21 is coupled to the host device 4 via a host interface, and controls communication between the memory controller 2 and the host device 4. For example, the host interface circuit 21 receives a host command from the host device 4. The memory interface circuit 25 is coupled to the semiconductor memory device 1 via a memory interface, and controls communication between the memory controller 2 and the semiconductor memory device 1. For example, the memory interface circuit 25 generates, based on a host command from the host device 4, a command set including a command and address information, and transmits the command set to the semiconductor memory device 1. The memory interface transfers, for example, a chip enable signal CEn, a command latch enable signal CLE, an address latch enable signal ALE, a write enable signal WEn, a read enable signal REn, a write protect signal WPn, a ready/busy signal R/Bn, and signals DQ.

(2) Semiconductor Memory Device

Figure 2:
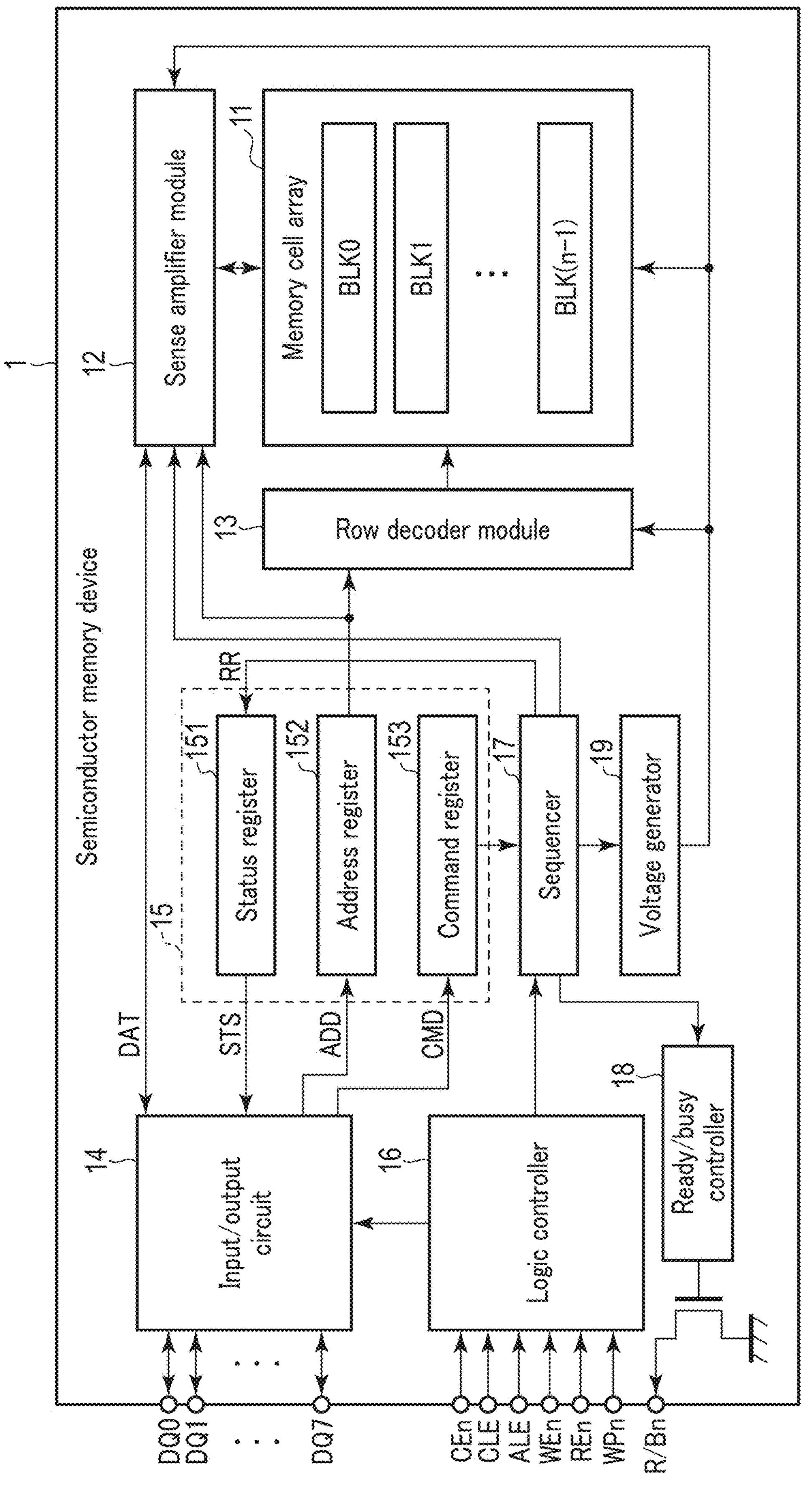
FIG. 2 is a block diagram showing an example of the configuration of the semiconductor memory device according to the first embodiment.

FIG. 2 is a block diagram showing an example of the configuration of the semiconductor memory device 1 according to the first embodiment. The semiconductor memory device 1 according to the first embodiment is, for example, a NAND flash memory capable of nonvolatilely storing data.

The semiconductor memory device 1 includes a memory cell array 11, a sense amplifier module 12, a row decoder module 13, an input/output circuit 14, a register 15, a logic controller 16, a sequencer 17, a ready/busy controller 18, and a voltage generator 19. The semiconductor memory device 1 executes various operations, such as a write operation for storing write data in the memory cell array 11 and a read operation for reading read data from the memory cell array 11.

The memory cell array 11 includes blocks BLK0 to BLK(n−1) (where n is an integer not less than 1). Each block BLK includes a plurality of non-volatile memory cells each associated with a bit line and a word line, and corresponds to a data erase unit, for example. For example, a single-level cell (SLC) mode, multi-level cell (MLC) mode, three-level cell (TLC) mode, and quad-level cell (QLC) mode can be applied to the semiconductor memory device 1. Each memory cell retains 1-bit data in the SLC mode, 2-bit data in the MLC mode, 3-bit data in the TLC mode, and 4-bit data in the QLC mode. Each memory cell may be configured to retain 5-or-more-bit data.

The input/output circuit 14 controls input and output of the signals DQ to and from the memory controller 2. The signals DQ include, for example, a command CMD, data DAT, address information ADD, and status information STS. Examples of the command CMD include a command for causing the semiconductor memory device 1 to execute processing corresponding to the host command from the host device 4. The data DAT includes write data or read data (hereinafter, descriptions will be provided using a reference symbol DAT for both of the write data and the read data for ease of reference). The address information ADD includes, for example, a column address and a row address. The status information STS includes, for example, information on a result of a write operation or read operation executed in the semiconductor memory device 1.

Specifically, the input/output circuit 14 includes an input circuit and an output circuit, which perform processing to be described below. The input circuit receives, from the memory controller 2, write data DAT, address information ADD, and a command CMD. The input circuit transfers the received write data DAT to the sense amplifier module 12, and transfers the received address information ADD and command CMD to the register 15. The output circuit receives status information STS from the register 15, and receives read data DAT from the sense amplifier module 12. The output circuit transmits the received status information STS and read data DAT to the memory controller 2. The input/output circuit 14 and the sense amplifier module 12 are coupled to each other via a data bus. The data bus includes, for example, eight data lines 100 to 107, which correspond to signals DQ0 to DQ7, respectively. The number of data lines IO is not limited to eight, and may be, for example, 16 or 32, or any other number.

The register 15 includes a status register 151, an address register 152, and a command register 153.

The status register 151 retains status information STS, and transfers the status information STS to the input/output circuit 14 based on an instruction from the sequencer 17.

The address register 152 retains address information ADD transferred from the input/output circuit 14, and transfers the address information ADD to the sequencer 17. The address register 152 transfers a column address in the address information ADD to the sense amplifier module 12, and transfers a row address in the address information ADD to the row decoder module 13.

The command register 153 retains a command CMD transferred from the input/output circuit 14, and transfers the command CMD to the sequencer 17.

The logic controller 16 receives, from the memory controller 2, for example, a chip enable signal CEn, a command latch enable signal CLE, an address latch enable signal ALE, a write enable signal WEn, a read enable signal REn, and a write protect signal WPn. The logic controller 16 controls the input/output circuit 14 and the sequencer 17 based on the received signals.

The chip enable signal CEn is a signal used for enabling the semiconductor memory device 1. The command latch enable signal CLE is a signal used for notifying the input/output circuit 14 that a command CMD is being transmitted by the signals DQ being input to the semiconductor memory device 1. The address latch enable signal ALE is a signal used for notifying the input/output circuit 14 that address information ADD is being transmitted by the signals DQ being input to the semiconductor memory device 1. The write enable signal WEn and read enable signal REn are signals used for enabling input and output of the signals DQ by the input/output circuit 14. The write enable signal WEn indicates, for example, when a command or address information is transmitted to the semiconductor memory device 1 by the signals DQ. The write protect signal WPn is a signal used for prohibiting data writing and erasure in the semiconductor memory device 1.

The sequencer 17 receives a command CMD and address information ADD, and controls the operation of the entire semiconductor memory device 1 in accordance with the received command CMD and address information ADD. The sequencer 17 controls, for example, the sense amplifier module 12, the row decoder module 13, the voltage generator 19, and executes various operations, such as a write operation and a read operation.

The sequencer 17 generates status information STS and transmits the generated status information STS to the status register 151. The status information STS includes read-ready information RR. The read-ready information RR indicates whether the semiconductor memory device 1 is in a read-ready state or a read-busy state. In the read-ready state, the semiconductor memory device 1 accepts a command for causing the semiconductor memory device 1 to execute a read operation. In the read-busy state, the semiconductor memory device 1 does not accept the command. The semiconductor memory device 1 "accepting" the command means that, after receiving the command, the semiconductor memory device 1 executes a read operation corresponding to the command. The semiconductor memory device 1 not "accepting" the command means that, even if receiving the command, the semiconductor memory device 1 does not execute a read operation corresponding to the command. Hereinafter, the term "accept" will be used in the same sense. "Not accept" will also be expressed as "reject". In response to a command, the sequencer 17 instructs the status register 151 to transfer status information STS to the input/output circuit 14.

The ready/busy controller 18 generates a ready/busy signal R/Bn in accordance with the control by the sequencer 17, and transmits the generated ready/busy signal R/Bn to the memory controller 2. The ready/busy signal R/Bn is a signal used for notifying the memory controller 2 of whether the semiconductor memory device 1 is in a ready state or in a busy state. In the ready state, the semiconductor memory device 1 accepts a command from the memory controller 2. In the busy state, the semiconductor memory device 1 does not accept, for example, a command for causing the semiconductor memory device 1 to execute an operation involving access to the memory cell array 11 from the memory controller 2. The operation includes, for example, a write operation, a read operation, and an erase operation. The semiconductor memory device 1 is set to depend on the read-ready information RR, not the ready/busy signal R/Bn, to determine whether or not to accept a command for causing the semiconductor memory device 1 to execute a read operation.

The voltage generator 19 generates various voltages based on control by the sequencer 17, and supplies the generated voltages to the memory cell array 11, the sense amplifier module 12, the row decoder module 13, and the like.

The sense amplifier module 12 receives a column address from the address register 152, and decodes the received column address. Based on a result of the decoding, the sense amplifier module 12 executes an operation to transfer data DAT between the memory controller 2 and the memory cell array 11. That is, the sense amplifier module 12 senses the threshold voltages of memory cell transistors in the memory cell array 11 to generate read data DAT, and outputs the generated read data DAT to the memory controller 2 via the input/output circuit 14. The sense amplifier module 12 also receives write data DAT from the memory controller 2 via the input/output circuit 14, and transfers the received write data DAT to the memory cell array 11.

The row decoder module 13 receives a row address from the address register 152, and decodes the received row address. The row decoder module 13 selects, based on a result of the decoding, a block BLK on which various operations, such as a read operation and a write operation, are to be executed. The row decoder module 13 can transfer voltages supplied from the voltage generator 19 to the selected block BLK.

(3) Memory Cell Array

Figure 3:
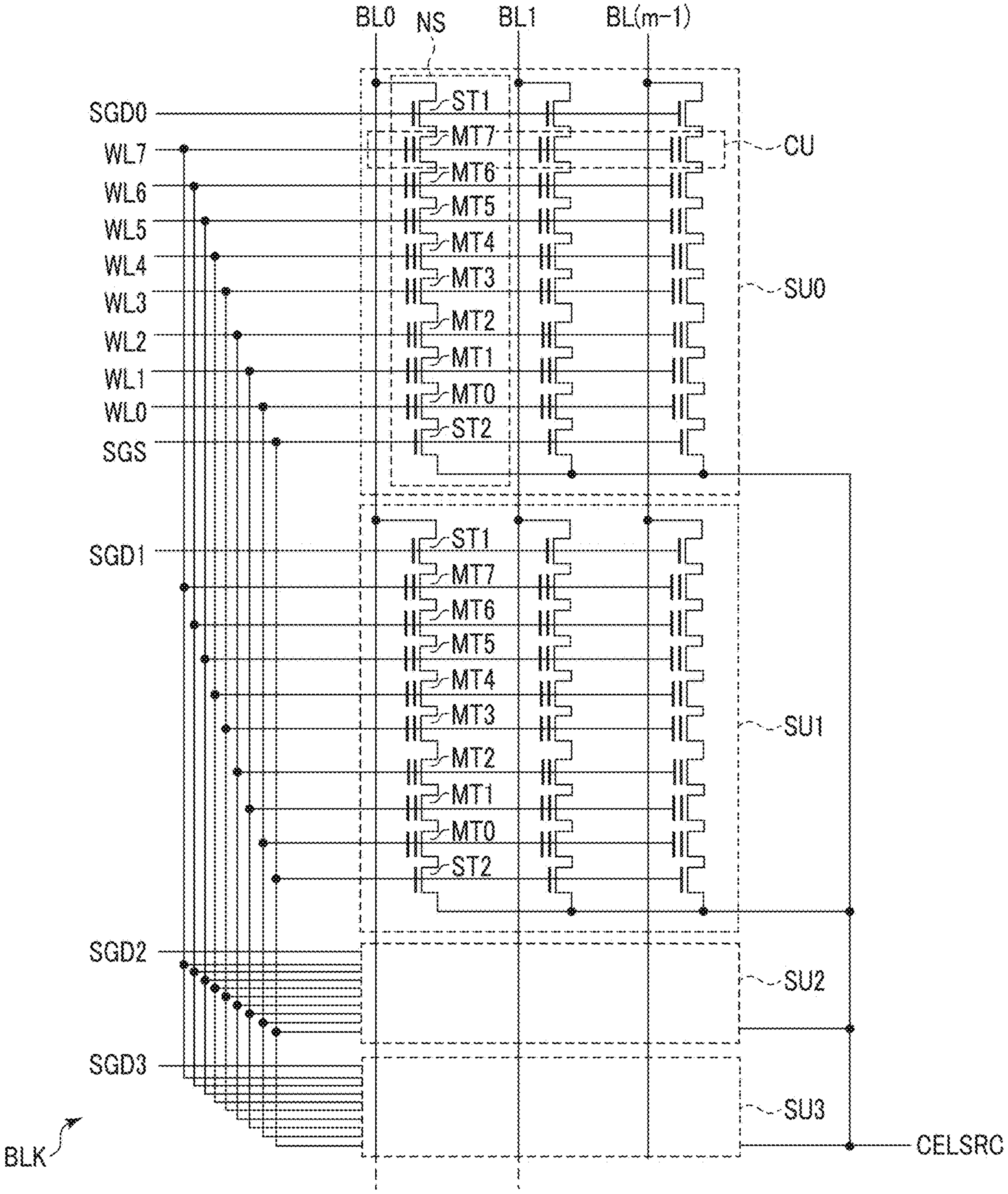
FIG. 3 shows an example of the circuit configuration of a memory cell array of the semiconductor memory device according to the first embodiment.

FIG. 3 shows an example of the circuit configuration of the memory cell array 11 of the semiconductor memory device 1 according to the first embodiment. As an example of the circuit configuration of the memory cell array 11, FIG. 3 shows an example of the circuit configuration of one block BLK included in the memory cell array 11. Each of the other blocks BLK included in the memory cell array 11 has, for example, the same circuit configuration as that shown in FIG. 3.

The block BLK includes, for example, four string units SU0 to SU3. Each string unit SU includes a plurality of NAND strings NS. The NAND strings NS are in one-to-one correspondence with respective m bit lines BL0 to BL(m−1) (where m is an integer not less than 1). Each NAND string NS is coupled to a corresponding bit line BL, and includes, for example, memory cell transistors MT0 to MT7 and select transistors ST1 and ST2. Each memory cell transistor MT includes a control gate (hereinafter also referred to as a "gate") and a charge storage layer, and nonvolatilely stores data. The select transistors ST1 and ST2 are each used in various operations to select a NAND string NS including the select transistors ST1 and ST2.

The drain of the select transistor ST1 is coupled to a bit line BL corresponding to the NAND string NS including the select transistor ST1. Memory cell transistors MT0 to MT7 are coupled in series between the source of the select transistor ST1 and the drain of the select transistor ST2 of the NAND string NS. The source of the select transistor ST2 is coupled to a source line CELSRC.

In the example of FIG. 3, the following description applies to each of the cases where j is an integer from 0 to 3, and each of the cases where k is an integer from 0 to 7. The gates of the select transistors ST1 of the NAND strings NS included in a string unit SUj are coupled in common to a select gate line SGDj. The gates of the select transistors ST2 of the NAND strings NS included in the same block BLK are coupled in common to a select gate line SGS. The gates of the memory cell transistors MTk of the NAND strings NS included in the same block BLK are coupled in common to a word line WLk.

Each bit line BL is coupled to the drains of the select transistors ST1 of the corresponding NAND strings NS included in the respective string units SU of the same block BLK. The source line CELSRC is shared by a plurality of string units SU.

A set of memory cell transistors MT coupled in common to one word line WL in one string unit SU is called, for example, a "cell unit CU". A set of 1-bit data of the same order retained in the memory cell transistors MT in a cell unit CU is referred to as, for example, "1-page data". Each cell unit CU may retain a plurality of "1-page data" items.

A circuit configuration of the memory cell array 11 is described above; however, the circuit configuration of the memory cell array 11 is not limited thereto. For example, the number of string units SU included in each block BLK may be any number. The number of memory cell transistors MT, the number of select transistors ST1, and the number of select transistors ST2 in each NAND string NS may also be any number. The number of word lines WL, the number of select gate lines SGD, and the number of select gate lines SGS are changed based on the number of memory cell transistors MT, the number of select transistors ST1, and the number of select transistors ST2 in each NAND string NS.

(4) Threshold Voltage Distribution of Memory Cell Transistors

Figure 4:
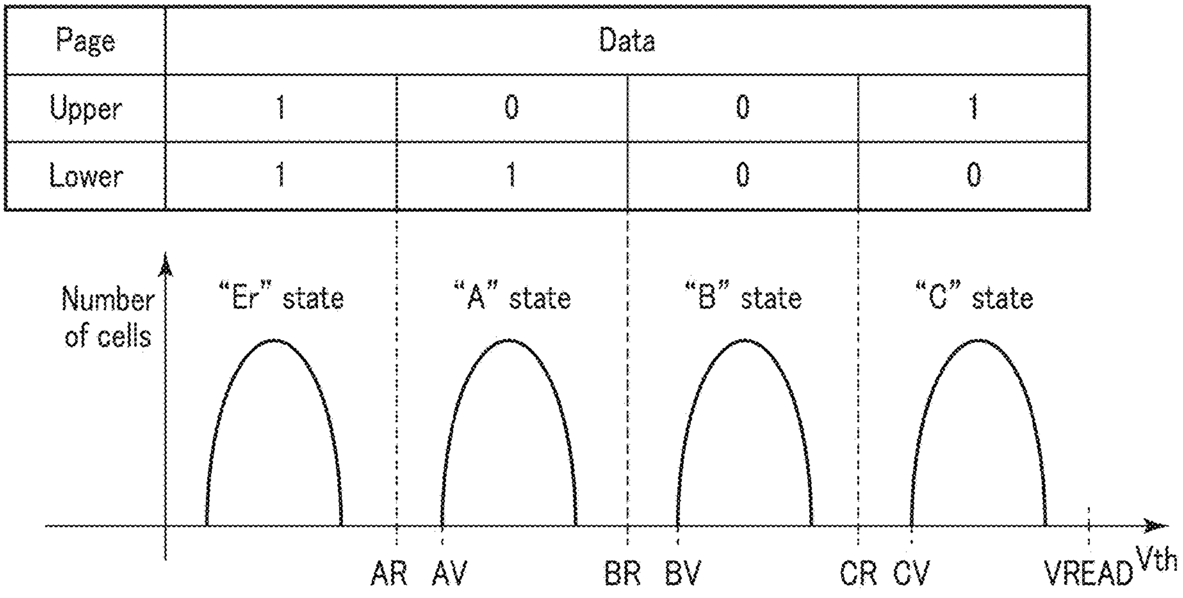
FIG. 4 shows an example of threshold voltage distribution formed by memory cell transistors of the semiconductor memory device according to the first embodiment.

FIG. 4 shows an example of threshold voltage distribution, data allocation, read voltages, and verify voltages in the case where each memory cell transistor MT in the memory cell array 11 shown in FIG. 3 retains 2-bit data.

The memory cell transistors MT each retain the 2-bit data based on the minimum potential difference (hereinafter referred to as a "threshold voltage") between the gate and source, which enables switching of the memory cell transistor MT from OFF to ON. In a write operation, a program operation to raise the threshold voltage of a memory cell transistor MT by injecting electrons into the charge storage layer of the select memory cell transistor MT is performed.

FIG. 4 shows an example of four threshold voltage distribution lobes formed as a result of the above-described threshold voltage control. Specifically, FIG. 4 schematically shows an example of the graph showing a relationship between a threshold voltage value and the number of memory cell transistors MT the threshold voltage of which takes that value. The horizontal axis indicates voltages Vth corresponding to threshold voltages of memory cell transistors MT. The voltage Vth is a voltage applied to the gate of a memory cell transistor MT to bring the potential difference between the gate and source of the memory cell transistor MT to the threshold voltage when for example a reference voltage is applied to the source of the memory cell transistor MT. Descriptions of FIG. 4 will be provided on the assumption that the reference voltage is applied to the source of the memory cell transistor MT. The vertical axis indicates the number of memory cell transistors MT.

The four threshold voltage distribution lobes correspond to, for example, an "Er" state, "A" state, "B" state, and "C" state, respectively. Accordingly, the memory cell transistors MT are distinguished as being in the "Er" state, "A" state, "B" state, and "C" state in accordance with the threshold voltages of the memory cell transistors MT. The threshold voltages of the memory cell transistors MT increase in the order of the "Er" state, "A" state, "B" state, and "C" state. For example, data "11" ("upper bit/lower bit") is allocated to the "Er" state, data "01" is allocated to the "A" state, data "00" is allocated to the "B" state, and data "10" is allocated to the "C" state. The data allocated to each state is the data stored in a memory cell transistor MT in that state.

In a write operation, a verify operation to verify whether or not the threshold voltage of a memory cell transistor MT has exceeded a predetermined voltage is performed. Verify voltages for use in the verify operation are set. Specifically, a verify voltage AV is set for the "A" state, a verify voltage BV is set for the "B" state, and a verify voltage CV is set for the "C" state.

The case where the verify voltage AV is applied to the gate of a memory cell transistor MT will be described. When the memory cell transistor MT is turned on, it can be understood that the memory cell transistor MT is in the "Er" state. In contrast, when the memory cell transistor MT is OFF, it can be understood that the memory cell transistor MT is in one of the "A" state, "B" state, and "C" state. Accordingly, it can be verified whether or not the threshold voltage of a write-target memory cell transistor MT has been included in the threshold voltage distribution lobe of one of the "A" state, "B" state, and "C" state as a result of, for example, a write operation to write data "01". The same applies to the other verify voltages BV and CV.

In a read operation, which state each memory cell transistor MT is in is judged. Read voltages for use in a read operation are set. Specifically, a read voltage AR is set for the "A" state, a read voltage BR is set for the "B" state, and a read voltage CR is set for the "C" state.

The case where the read voltage AR is applied to the gate of a memory cell transistor MT will be described. When the memory cell transistor MT is turned on, it can be understood that the memory cell transistor MT is in the "Er" state. In contrast, when the memory cell transistor MT is OFF, it can be understood that the memory cell transistor MT is in one of the "A" state, "B" state, and "C" state. Accordingly, it can be judged whether the memory cell transistor MT is in the "Er" state or in one of the "A" state, "B" state, and "C" state. The same applies to the read voltages BR and CR.

When a read operation is executed, some of the electrons stored in the charge storage layer of a memory cell transistor MT may escape from the charge storage layer with the passage of time, causing a drop in the threshold voltage of the memory cell transistor MT. To cope with such a drop in the threshold voltage, each read voltage is set to be lower than the verify voltage set for the same state as the read voltage. That is, the read voltage AR is lower than the verify voltage AV, the read voltage BR is lower than the verify voltage BV, and the read voltage CR is lower than the verify voltage CV.

In addition, a read pass voltage VREAD is set. The read pass voltage VREAD is a voltage that turns on a memory cell transistor MT regardless of data stored therein when the voltage is applied to the gate of the memory cell transistor MT.

The above-described number of bits of data stored in one memory cell transistor MT and allocation of data to the threshold voltage distribution lobes are mere examples, and the embodiment is not limited thereto.

(5) Sense Amplifier Module

Figure 5:
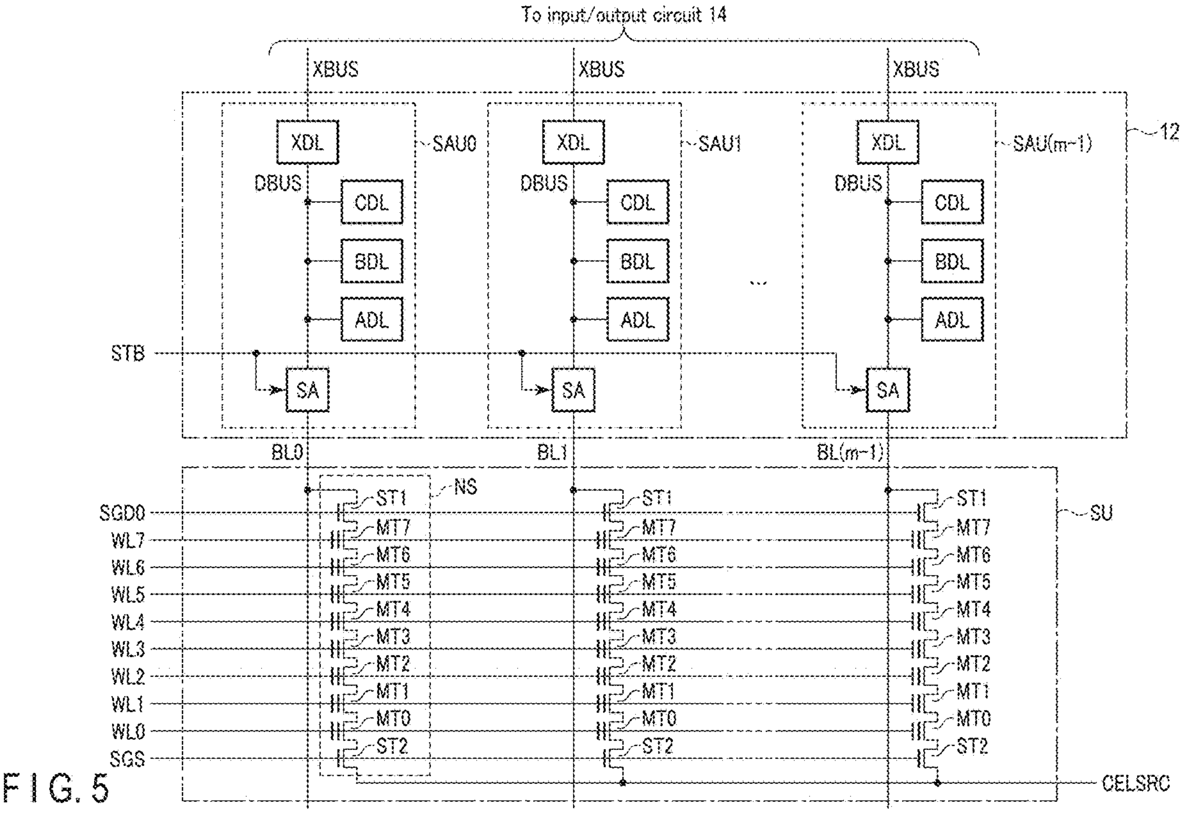
FIG. 5 is a block diagram showing an example of the configuration of a sense amplifier module of the semiconductor memory device according to the first embodiment.

FIG. 5 is a block diagram showing an example of the configuration of the sense amplifier module 12 of the semiconductor memory device 1 according to the first embodiment. The configuration of the sense amplifier module 12 to be described in detail below is merely an example, and various configurations can be applied to the sense amplifier module 12.

The sense amplifier module 12 includes, for example, m sense amplifier units SAU0 to SAU(m−1). The m sense amplifier units SAU0 to SAU(m−1) are in one-to-one correspondence with, for example, respective m bit lines BL0 to BL(m−1).

Each sense amplifier unit SAU includes, for example, a sense amplifier circuit SA and latch circuits ADL, BDL, CDL, and XDL. The number of latch circuits included in each sense amplifier unit SAU is based on, for example, the number of bits of data retained in each memory cell transistor MT.

The sense amplifier circuit SA is coupled to a bit line BL corresponding to a sense amplifier unit SAU including the sense amplifier circuit SA. The sense amplifier circuit SA and the latch circuits ADL, BDL, CDL, and XDL are coupled to one another via a bus DBUS in such a manner that data can be transmitted and received therebetween.

In a read operation, the sense amplifier circuit SA reads data by sensing the threshold voltage of a memory cell transistor MT based on the current flowing through the corresponding bit line BL or the potential of the bit line BL. In a write operation, the sense amplifier circuit SA applies a voltage to the corresponding bit line BL. In a read operation, a control signal STB is supplied to the sense amplifier circuit SA by, for example, the sequencer 17. The sense amplifier circuit SA determines read data at a time when the control signal STB is asserted, and transfers the read data to, for example, one of the latch circuits ADL, BDL, CDL, and XDL.

The latch circuits ADL, BDL, and CDL temporarily retain read data and write data.

The latch circuit XDL enables data transmission and reception between a sense amplifier unit SAU including the latch circuit XDL and the input/output circuit 14. For example, in a write operation, each bit of data received from the memory controller 2 is first retained in the latch circuit XDL, and then transferred to the latch circuit ADL, BDL, or CDL, or the sense amplifier SA. In a read operation, each bit of data in the latch circuit ADL, BDL, or CDL or the sense amplifier SA is first transferred to the latch circuit XDL and retained therein, and then transferred to the input/output circuit 14 and output to the outside of the semiconductor memory device 1.

As described above, the latch circuit XDL, coupled in series between the input/output circuit 14 and the sense amplifier circuit SA, functions as a cache memory of the semiconductor memory device 1. Accordingly, when the latch circuits XDL are available (i.e., unoccupied), the semiconductor memory device 1 can enter the ready state even if the other latch circuits are busy.

(6) Read-Ready Information

For example, the semiconductor memory device 1 is in the read-busy state from receipt of a command set (hereinafter also referred to as a "read operation-related command set") for causing the semiconductor memory device 1 to execute a read operation to transfer of bits of data read from the memory cell array 11 by the read operation to the latch circuits XDL. In other words, the semiconductor memory device 1 is in the read-busy state from receipt of a read operation-related command set to completion of access to the memory cell array 11 by the read operation. For example, during periods other than this period, the semiconductor memory device 1 is in the read-ready state.

For example, in response to transition of the semiconductor memory device 1 between the read-ready state and the read-busy state, the sequencer 17 generates status information STS including read-ready information and transmits the generated status information STS to the status register 151.

FIG. 6 shows an example of the definition of status information STS transmitted by respective signals DQ, which is used by the semiconductor memory device 1 according to the first embodiment.

Regarding a command for causing the semiconductor memory device 1 to execute an operation which was immediately previously accepted by the semiconductor memory device 1, the memory controller 2 is notified through the signal DQ6 of, for example, whether or not the semiconductor memory device 1 is in the busy state due to the command. For example, when the semiconductor memory device 1 is in the busy state, the signal DQ6 is at a low (L) level (indicated as "O" in FIG. 6), and when the semiconductor memory device 1 is not in the busy state, but in the ready state, the signal DQ6 is at a high (H) level (indicated as "1" in FIG. 6). For example, while the signal DQ6 is at the L level, the ready/busy signal R/Bn may be at the L level, and while the signal DQ6 is at the H level, the ready/busy signal R/Bn may be at the H level. Described below as an example is the case where a write operation, a read operation, an erase operation, and the like are executed for each plane on the memory cell arrays included in the plane in the semiconductor memory device 1. When such operations are simultaneously executed in a plurality of planes, it is possible that the signal DQ6 is at the H level, whereas the ready/busy signal R/Bn is at the L level.

For example, when the signal DQ6 is at the H level, the memory controller 2 may be notified through the signal DQ0 of whether or not the relevant operation has succeeded. For example, when the operation has succeeded, the signal DQ0 is at the L level, and when the operation has failed, the signal DQ0 is at the H level.

The memory controller 2 is also notified of read-ready information RR through, for example, the signal DQ3. For example, when the semiconductor memory device 1 is in the read-busy state, the signal DQ3 is at the L level, and when the semiconductor memory device 1 is in the read-ready state, the signal DQ3 is at the H level. When a write operation, a read operation, an erase operation, and the like are executed for each plane as described above, the read-ready information RR may be information on the plane on which an operation corresponding to the command last accepted by the semiconductor memory device 1 is executed. In addition, there may be unused signals such as the signals DQ2 and DQ4 shown in FIG. 6.

Operation Example

Hereinafter, an operation example of the semiconductor memory device 1 according to the first embodiment will be described in detail, in which a write operation being executed is suspended, a read operation is started and, after completion of the read operation, the suspended write operation is resumed. The read operation executed in this manner will also be referred to as a "suspend read operation".

Described below is the case where a write operation is executed as the operation to be suspended; however, the present embodiment is not limited thereto. For example, the operation to be suspended may be an erase operation.

An example of the case where a write operation is executed as a normal program operation will be described below. In the normal program operation, the ready/busy signal R/Bn is at the L level (busy state), for example from the start to completion of the write operation, and is at the H level (ready state) after the completion of the write operation.

Hereinafter, an example of the case where the memory controller 2 does not know that the semiconductor memory device 1 is designed to be able to enter the read-ready state will be described.

Figure 7:
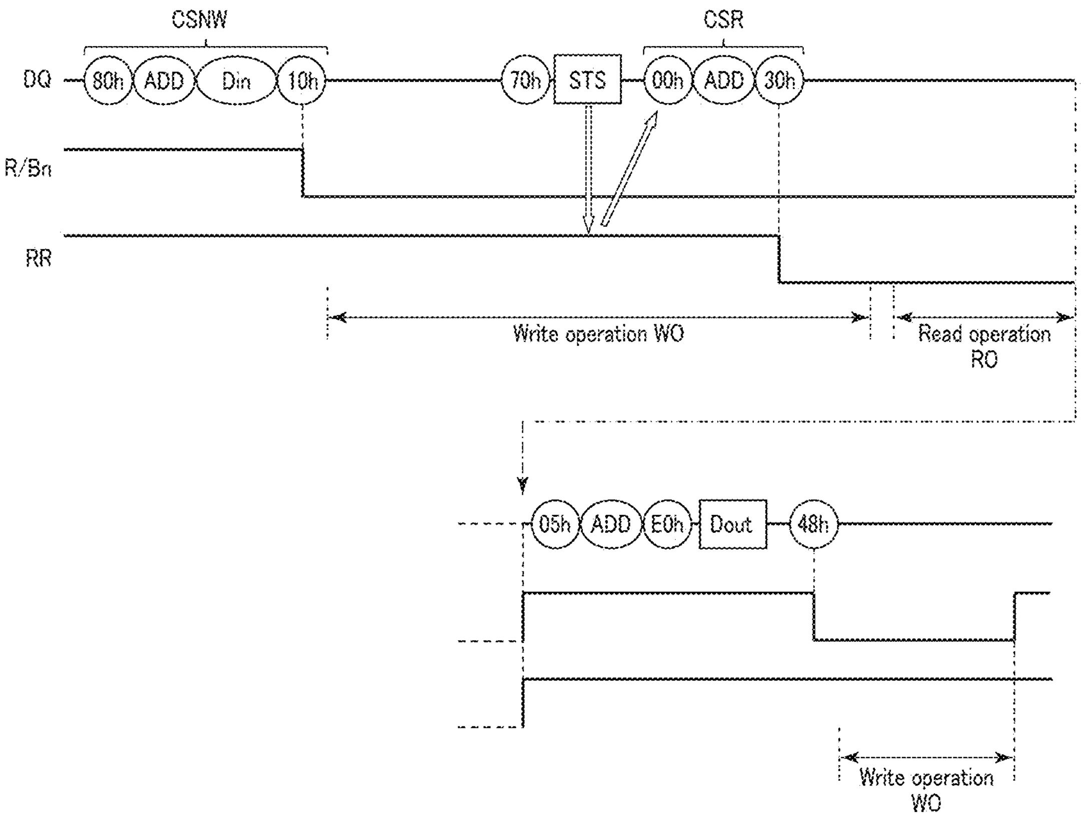
FIG. 7 shows an example of a timing chart showing command sequences, temporal changes of a ready/busy signal, and updates of read-ready information, which relate to a suspend read operation executed in the semiconductor memory device according to the first embodiment.

FIG. 7 shows an example of a timing chart showing command sequences, temporal changes of the ready/busy signal R/Bn, and updates of the read-ready information RR relating to a suspend read operation executed in the semiconductor memory device 1 according to the first embodiment. Hereinafter, the write data DAT and read data DAT described with reference to FIG. 2 will be respectively referred to as write data Din and read data Dout for ease of reference. Also hereinafter, when a signal is described as being at a level, the signal should be regarded as remaining at the described level unless control to change the signal to another level is explicitly described thereafter. The same applies to the descriptions of the other drawings.

While the memory controller 2 is receiving the ready/busy signal R/Bn at the H level, i.e., while the semiconductor memory device 1 is in the ready state, the memory controller 2 generates a command set (hereinafter also referred to as a "write-operation related command set") CSNW for causing the semiconductor memory device 1 to execute a write operation and transmits the command set CSNW to the semiconductor memory device 1. The command set CSNW includes a command "80h", address information ADD, write data Din, and a command "10h". The semiconductor memory device 1 receives the command set CSNW and starts a write operation WO. Details will be described below.

First, the memory controller 2 issues a command "80h" and transmits the command "80h" to the semiconductor memory device 1. The command "80h" is a command used to cause the semiconductor memory device 1 to execute a write operation. Then, the memory controller 2 issues address information ADD over, for example, five cycles, and transmits the address information ADD to the semiconductor memory device 1. The address information ADD issued over five cycles designates, for example, a write-target block BLK, and an area in the block BLK. Based on the address information ADD, the sequencer 17 identifies an area of the memory cell array 11 in which data is to be written. The address information ADD need not necessarily be issued over five cycles, and may be issued over any number of cycles.

Subsequently, the memory controller 2 transmits data Din to the semiconductor memory device 1. The sequencer 17 inputs each bit of the data Din to a latch circuit XDL corresponding to the area of the memory cell array 11 in which data is to be written.

The memory controller 2 also issues a command "10h" and transmits the command "10h" to the semiconductor memory device 1. The command "10h" is a command used to cause the semiconductor memory device 1 to execute a normal program operation as a write operation, based on the address information ADD and data Din received after the receipt of the command "80h".

In response to the receipt of the command "10h", the sequencer 17 causes the ready/busy controller 18 to transmit the ready/busy signal R/Bn to the memory controller 2 at the L level. The memory controller 2 is thereby notified that the semiconductor memory device 1 is in the busy state. In response to the receipt of the command "10h", the sequencer 17 controls the voltage generator 19, the sense amplifier module 12, the row decoder module 13, and the like and starts a write operation wo.

While the memory controller 2 is receiving the ready/busy signal R/Bn at the L level, i.e., while the semiconductor memory device 1 is in the busy state, the memory controller 2 receives, from the host device 4, a host command for causing the semiconductor memory device 1 to execute, for example, a high-priority read operation. The memory controller 2 may issue a command "70h" and transmits the command "70h" to the semiconductor memory device 1 so as to inquire whether or not the semiconductor memory device 1 accepts, for example, a read operation-related command set even though it is in the busy state. The semiconductor memory device 1 receives the command "70h". The command "70h" is a command used to cause the semiconductor memory device 1 to output status information STS retained in the status register 151 to the memory controller 2.

In response to the receipt of the command "70h", the sequencer 17 causes the semiconductor memory device 1 to output the status information STS retained in the status register 151 to the memory controller 2. In the output of the status information STS, an H-level signal is output as read-ready information RR. The H-level signal indicates that the semiconductor memory device 1 is in the read-ready state.

In response to the receipt of the read-ready information RR indicating that the semiconductor memory device 1 is in the read-ready state, the memory controller 2 generates a read operation-related command set CSR, and transmits the command set CSR to the semiconductor memory device 1. The command set CSR includes a command "00h", address information ADD, and a command "30h". The semiconductor memory device 1 accepts the command set CSR even though it is in the busy state, suspends the write operation wo, and starts a read operation RO. In response to the command "30h", the semiconductor memory device 1 enters the read-busy state. Details will be described below.

First, the memory controller 2 issues a command "00h" and transmits the command "00h" to the semiconductor memory device 1. The command "00h" is a command used to cause the semiconductor memory device 1 to execute a read operation. Then, the memory controller 2 issues address information ADD over, for example, five cycles, and transmits the address information ADD to the semiconductor memory device 1. The address information ADD issued over five cycles designates, for example, a read-target block BLK, and an area in the block BLK. The memory controller 2 also issues a command "30h" and transmits the command "30h" to the semiconductor memory device 1. The command "30h" is a command used to cause the semiconductor memory device 1 to execute a read operation, based on the address information ADD received after the receipt of the command "00h". In response to the receipt of the command "30h", the sequencer 17 generates status information STS. The generated status information STS includes read-ready information RR indicating that the semiconductor memory device 1 is in the read-busy state. The sequencer 17 transmits the generated status information STS to the status register 151.

The sequencer 17 suspends the write operation WO being executed at a given time and makes at least one latch circuit (for example, the latch circuit ADL) of each sense amplifier unit SAU unoccupied. Then, the sequencer 17 starts a read operation RO. Let us assume that the read operation RO in the following description includes an operation to transfer each bit of data read from the memory cell array 11 to a latch circuit XDL via an unoccupied latch circuit, but does not include an operation to output each bit of the data from the latch circuit XDL to the memory controller 2. The same applies to the descriptions of the other drawings.

After completion of the read operation RO, the sequencer 17 causes the ready/busy controller 18 to transmit the ready/busy signal R/Bn to the memory controller 2 at the H level. The memory controller 2 is thereby notified that the semiconductor memory device 1 is in the ready state. After completion of the read operation RO, the sequencer 17 generates status information STS. The generated status information STS includes read-ready information RR indicating that the semiconductor memory device 1 is in the read-ready state. The sequencer 17 transmits the generated status information STS to the status register 151.

In response to the receipt of the ready/busy signal R/Bn indicating that the semiconductor memory device 1 is in the ready state, the memory controller 2 generates a command set including a command "05h", address information ADD, and a command "E0h" and transmits the command set to the semiconductor memory device 1. The semiconductor memory device 1 receives the command set. The commands "05h" and "E0h" are commands used to cause the semiconductor memory device 1 to output read data transferred to the latch circuits XDL by a read operation to the memory controller 2. In response to the receipt of the command "E0h", the sequencer 17 causes the semiconductor memory device 1 to output data Dout transferred to the latch circuits XDL by the read operation RO to the memory controller 2. The above-described command "05h", address information ADD, and command "E0h" need not necessarily be issued. In such a case, the semiconductor memory device 1 may output the data Dout to the memory controller 2, using, for example, toggling of the read enable signal REn as a trigger. The same applies to the descriptions of the other drawings.

Thereafter, the memory controller 2 issues a command "48h", and transmits the command "48h" to the semiconductor memory device 1. The semiconductor memory device 1 receives the command "48h". The command "48h" is a command used to instruct the semiconductor memory device 1 to resume the suspended write operation.

In response to the receipt of the command "48h", the sequencer 17 causes the ready/busy controller 18 to transmit the ready/busy signal R/Bn to the memory controller 2 at the L level. The memory controller 2 is thereby notified that the semiconductor memory device 1 is in the busy state. In response to the receipt of the command "48h", the sequencer 17 resumes the suspended write operation WO. Suspension information on the suspension of the write operation WO is retained in, for example, a register in the sequencer 17, and the sequencer 17 resumes the write operation WO based on the suspension information retained in the register.

After completion of the write operation WO, the sequencer 17 causes the ready/busy controller 18 to transmit the ready/busy signal R/Bn to the memory controller 2 at the H level. The memory controller 2 is thereby notified that the semiconductor memory device 1 is in the ready state.

Described above is an example of the case where the memory controller 2 does not know that the semiconductor memory device 1 is designed to be able to enter the read-ready state. However, the present embodiment is not limited thereto. For example, when the memory controller 2 knows that the semiconductor memory device 1 is designed like that, it is not necessary for the memory controller 2 to refer to read-ready information RR using the command "70h" as described above.

Described above is the case where the semiconductor memory device 1 accepts the command set CSR as a read operation-related command set subsequently to the command set CSNW. However, the present embodiment is not limited thereto.

In, for example, an MLC-mode read operation, the semiconductor memory device 1 accepts a command set including a command "0Xh", a command "00h", address information ADD, and a command "30h". The command "0Xh" is a command for designating one page of a plurality of pages. For example, the read operation-related command set accepted by the semiconductor memory device 1 subsequently to the command set CSNW may be such a command set.

The semiconductor memory device 1 may also execute, for example, a read operation called a shift read operation. The semiconductor memory device 1 executes the shift read operation as follows. First, the semiconductor memory device 1 accepts in advance a command set including a command "EFh", address information ADD, and data of a shift value for read voltage. The command "EFh" is a command used to change parameters specifying various operations of the semiconductor memory device 1. The address information ADD designates an area in which the shift value is stored in the semiconductor memory device 1.

Then, the semiconductor memory device 1 accepts a command set including a command "5Dh", a command "0Xh", a command "00h", address information ADD, and a command "30h". The command "5Dh" is a command used to apply the shift value stored in the semiconductor memory device 1. In response to this, the semiconductor memory device 1 executes a shift read operation. For example, the read operation-related command set accepted by the semiconductor memory device 1 subsequently to the command set CSNW may be such a command set.

In addition, the semiconductor memory device 1 may execute a read operation in various modes. The modes include, for example, a mode called a fast read mode, in which a read operation is executed at a higher rate than usual, and a mode called a direct look ahead (DLA) mode, in which a read operation with improved reliability is executed. The semiconductor memory device 1 accepts, for example, a command set including a command designating a mode in which the semiconductor memory device 1 executes a read operation, a command "0Xh", a command "00h", address information ADD, and a command "30h". In response to this, the semiconductor memory device 1 executes a read operation in the designated mode. For example, the read operation-related command set accepted by the semiconductor memory device 1 subsequently to the command set CSNW may be such a command set.

Advantageous Effects

Figure 8:
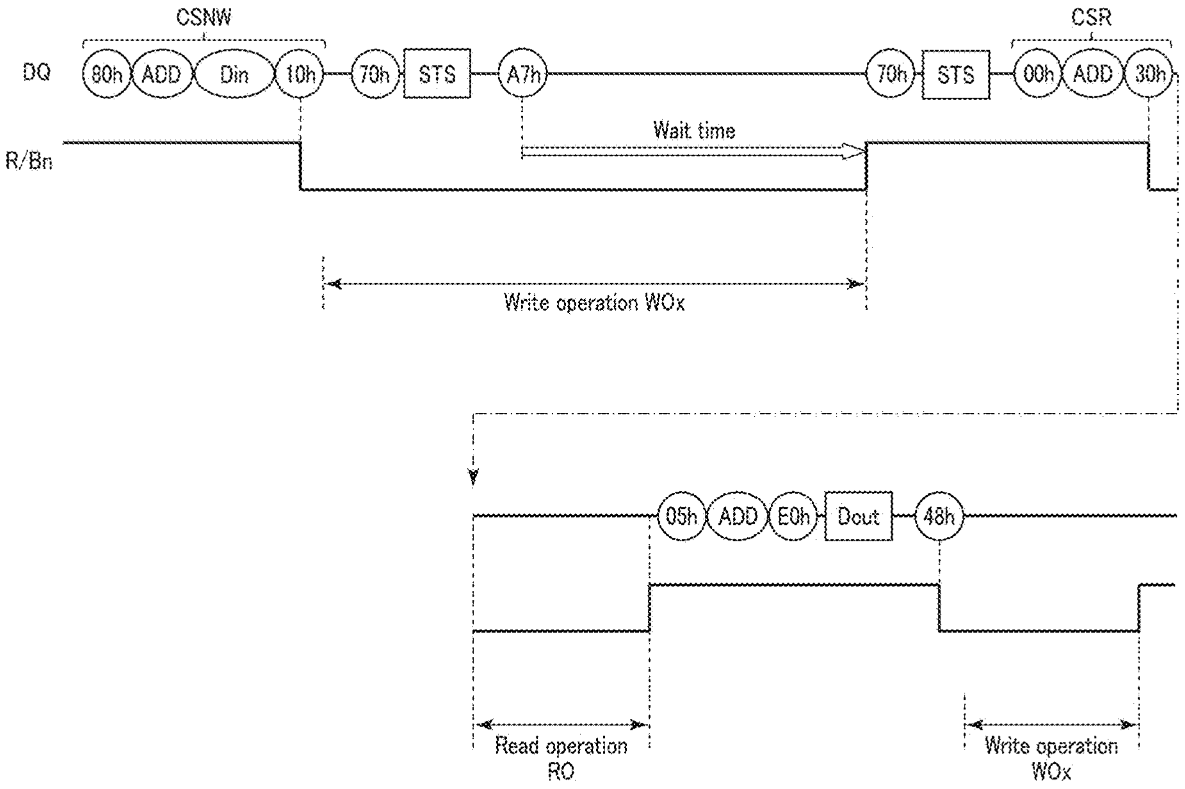
FIG. 8 shows an example of a timing chart showing command sequences and temporal changes of a ready/busy signal, which relate to a suspend read operation executed in a semiconductor memory device according to a comparative example of the first embodiment.

FIG. 8 shows an example of a timing chart showing command sequences and temporal changes of the ready/busy signal R/Bn relating to a suspend read operation executed in a semiconductor memory device according to a comparative example of the first embodiment. An example of the case where a write operation is executed as a normal program operation will be described.

The semiconductor memory device is in the busy state while executing a write operation WOx. To cause the semiconductor memory device in the busy state to execute a suspend read operation, the memory controller transmits a command "A7h" to the semiconductor memory device. The semiconductor memory device receives the command "A7h". The command "A7h" is a command used to cause the semiconductor memory device to suspend an operation being executed. In response to the receipt of the command "A7h", the semiconductor memory device suspends the write operation WOx being executed at a given time and makes at least one latch circuit of each sense amplifier unit unoccupied. By, for example, making the latch circuit unoccupied in this manner, the semiconductor memory device enters the ready state.

To confirm whether or not the semiconductor memory device has entered the ready state like this, the memory controller transmits a command "70h" to the semiconductor memory device. In response to the receipt of the command "70h", the semiconductor memory device outputs status information to the memory controller. After confirming that the semiconductor memory device has entered the ready state based on the status information, the memory controller transmits a command set CSR to the semiconductor memory device. The semiconductor memory device receives the command set CSR and starts a read operation RO.

In this way, the semiconductor memory device according to the comparative example of the first embodiment makes the memory controller wait from receiving the command "A7h" until entering the ready state through suspending the write operation WOx. After confirming that the semiconductor memory device has entered the ready state using the command "70h", the memory controller transmits a command set CSR. The above-described transmission and reception of the "command "70h" and status information occupies some of the functions of the memory controller and some of the memory interface between the memory controller and the semiconductor memory device while the semiconductor memory device is in the ready state.

In contrast, while being in the busy state, the semiconductor memory device 1 according to the first embodiment outputs status information STS retained in the status register 151 to the memory controller 2 in response to the receipt of the command "70h". The status information STS includes read-ready information RR. In response to the receipt of read-ready information RR indicating that the semiconductor memory device 1 is in the read-ready state, the memory controller 2 transmits a command set CSR to the semiconductor memory device 1. That is, the memory controller 2 need not transmit a command "A7h" to the semiconductor memory device 1 and wait until the semiconductor memory device 1 enters the ready state. The semiconductor memory device 1 receives the command set CSR, suspends the write operation WO, and starts the read operation RO. Accordingly, the semiconductor memory device 1 can accept the command set CSR without a special command such as the command "A7h", even when in the busy state. Therefore, the semiconductor memory device 1 can cause the memory controller 2 to transmit a read operation-related command set earlier.

Furthermore, in the semiconductor memory device 1, the above-described transmission and reception of the command "70h" and status information STS is performed while the semiconductor memory device 1 is in, for example, the busy state. Therefore, the semiconductor memory device 1 may prevent the transmission and reception from occupying some of the functions of the memory controller 2 and some of the memory interface between the memory controller 2 and the semiconductor memory device 1 while the semiconductor memory device 1 is in the ready state.

In addition, the semiconductor memory device according to the comparative example of the first embodiment waits for the command set CSR being transmitted from the memory controller, after suspending the write operation WOx and entering the ready state. In contrast, the semiconductor memory device 1 according to the first embodiment may receive the command set CSR before suspending the write operation WO. When the semiconductor memory device 1 is in receipt of the command set CSR before suspending the write operation wo, the semiconductor memory device 1 starts the read operation RO after suspending the write operation WO without waiting for the command set CSR being transmitted from the memory controller 2. Accordingly, the semiconductor memory device 1 may start the suspend read operation earlier.

Moreover, while being in the ready state, the semiconductor memory device according to the comparative example of the first embodiment accepts a command set CSR without receiving a command "A7h". Therefore, the memory controller controls whether or not to transmit a command "A7h" prior to the command set CSR in accordance with whether the semiconductor memory device is in the busy state or the ready state. In contrast, the semiconductor memory device 1 according to the first embodiment does not require the command "A7h" and, therefore, the memory controller 2 does not perform such control. Accordingly, use of the semiconductor memory device 1 facilitates system design.

Modifications

The write operation executed by the semiconductor memory device 1 is not limited to the one executed as a normal program operation. Hereinafter, an example of the case where the write operation is executed as a cache program operation will be described. In the cache program operation, the ready/busy signal R/Bn is, for example, at the L level (busy state) until write data input to the latch circuits XDL is transferred to other latch circuits (such as latch circuits ADL), and is at the H level (ready state) after the transfer.

Hereinafter, the case where a suspended write operation is resumed in response to a resume command such as a command "48h" will be described; however, the suspended write operation may be resumed without the resume command.

Each modification will be described, focusing on a configuration example, operation example, and advantageous effect different from those described above.

(1) First Modification

Figure 9:
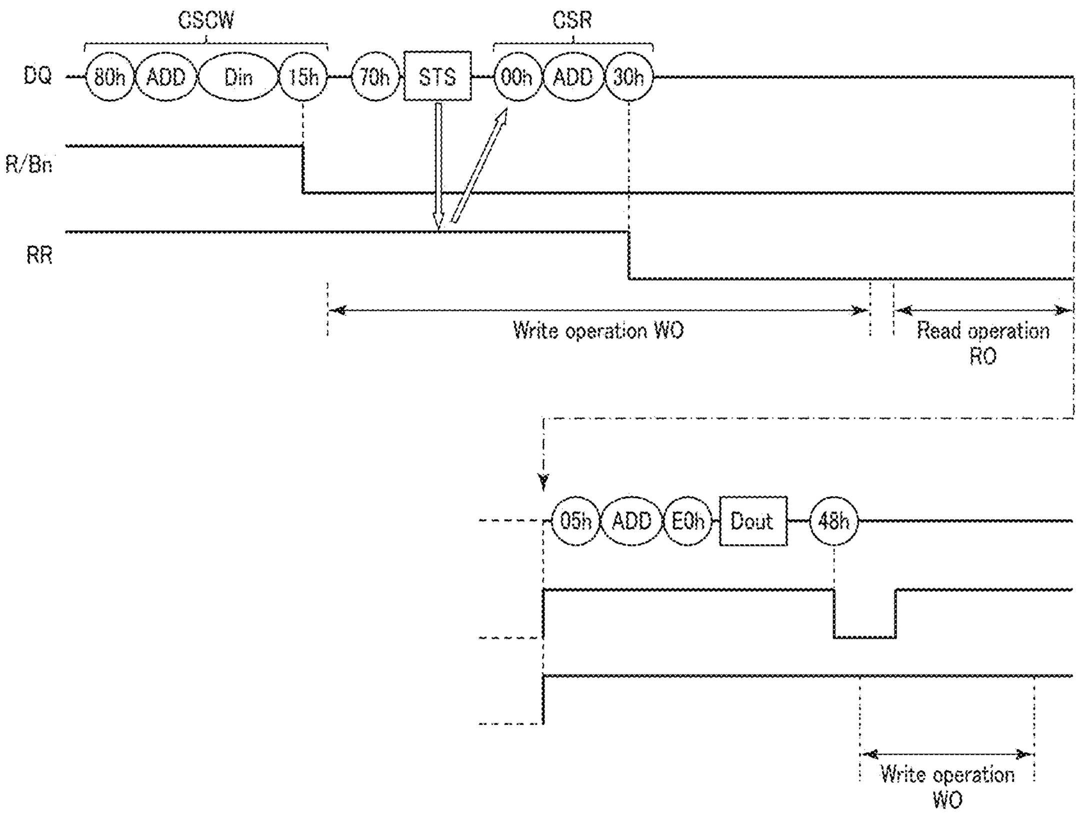
FIG. 9 shows an example of a timing chart showing command sequences, temporal changes of a ready/busy signal, and updates of read-ready information, which relate to a suspend read operation executed in a semiconductor memory device according to a first modification of the first embodiment.

FIG. 9 shows an example of a timing chart showing command sequences, temporal changes of the ready/busy signal R/Bn, and updates of the read-ready information RR relating to a suspend read operation executed in a semiconductor memory device 1 according to a first modification of the first embodiment.

As in the example of FIG. 7, while the memory controller 2 is receiving the ready/busy signal R/Bn at the H level, i.e., while the semiconductor memory device 1 is in the ready state, the memory controller 2 generates a command set CSCW related to a write operation WO and transmits the command set CSCW to the semiconductor memory device 1. The command set CSCW differs from the command set CSNW described with reference to FIG. 7 in terms of including a command "15h" instead of the command "10h". The command "15h" is a command used to cause the semiconductor memory device 1 to execute a cache program operation as a write operation, based on the address information ADD and data Din received after the receipt of the command "80h". As in the example of FIG. 7, the semiconductor memory device 1 receives the command set CSCW and starts the write operation wo.

In response to the receipt of the command "15h", the sequencer 17 causes the ready/busy controller 18 to transmit the ready/busy signal R/Bn to the memory controller 2 at the L level. The memory controller 2 is thereby notified that the semiconductor memory device 1 is in the busy state.

While the memory controller 2 is receiving the ready/busy signal R/Bn at the L level, i.e., while the semiconductor memory device 1 is in the busy state, the memory controller 2 receives, from the host device 4, a host command for causing the semiconductor memory device 1 to execute, for example, a high-priority read operation. The memory controller 2 may issue a command "70h" and transmit the command "70h" to the semiconductor memory device 1, and the semiconductor memory device 1 receives the command "70h".

In response to the receipt of the command "70h", the sequencer 17 causes the semiconductor memory device 1 to output the status information STS retained in the status register 151 to the memory controller 2. In the output of the status information STS, an H-level signal is output as read-ready information RR. The H-level signal indicates that the semiconductor memory device 1 is in the read-ready state.

As in the example of FIG. 7, in response to the receipt of the read-ready information RR indicating that the semiconductor memory device 1 is in the read-ready state, the memory controller 2 generates a command set CSR and transmits the command set CSR to the semiconductor memory device 1. The semiconductor memory device 1 accepts the command set CSR even though it is in the busy state, suspends the write operation WO, and starts a read operation RO. Specifically, the sequencer 17 suspends the write operation WO being executed at a given time and makes at least one latch circuit (for example, the latch circuit ADL) of each sense amplifier unit SAU unoccupied. Then, the sequencer 17 starts a read operation RO. As in the example of FIG. 7, in response to the command "30h", the semiconductor memory device 1 enters the read-busy state.

The operation from the start of the read operation RO to the output of read data Dout from the semiconductor memory device 1 to the memory controller 2 is the same as that in the example of FIG. 7.

After the output, the memory controller 2 issues a command "48h", and transmits the command "48h" to the semiconductor memory device 1. The semiconductor memory device 1 receives the command "48h". In response to the receipt of the command "48h", the sequencer 17 causes the ready/busy controller 18 to transmit the ready/busy signal R/Bn to the memory controller 2 at the L level. The memory controller 2 is thereby notified that the semiconductor memory device 1 is in the busy state. In response to the receipt of the command "48h", the sequencer 17 resumes the suspended write operation WO. Subsequently, the sequencer 17 moves the bits retained in the latch circuits XDL of data Din from the latch circuits XDL to other latch circuits. The latch circuits XDL are thereby made unoccupied, and the sequencer 17 causes the ready/busy controller 18 to transmit the ready/busy signal R/Bn to the memory controller 2 at the H level during the execution of the write operation WO. The memory controller 2 is thereby notified that the semiconductor memory device 1 is in the ready state.

Figure 10:
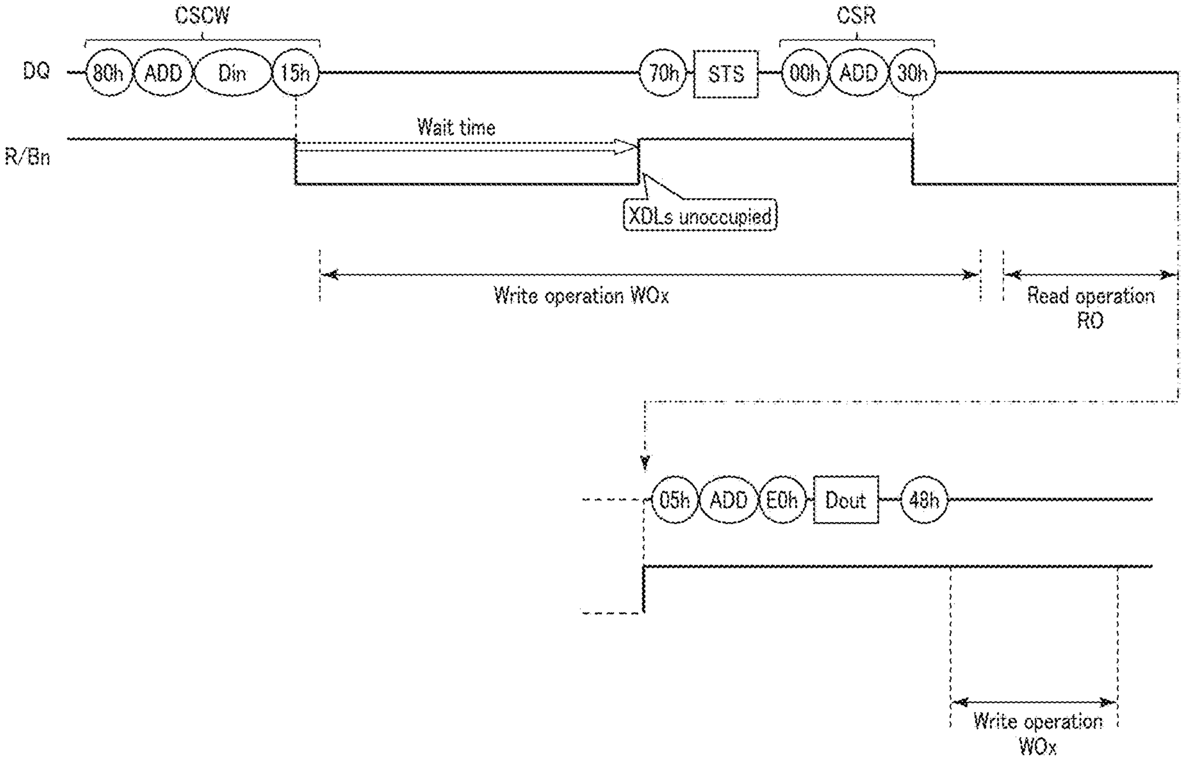
FIG. 10 shows an example of a timing chart showing command sequences and temporal changes of a ready/busy signal, which relate to a suspend read operation executed in a semiconductor memory device according to a comparative example of the first modification of the first embodiment.

FIG. 10 shows an example of a timing chart showing command sequences and temporal changes of the ready/busy signal R/Bn relating to a suspend read operation executed in a semiconductor memory device according to a comparative example of the first modification of the first embodiment. An example of the case where the write operation is executed as a cache program operation will be described.

The semiconductor memory device enters the busy state when starting the write operation WOx, and enters the ready state after moving write data Din from the latch circuits XDL to other latch circuits, thereby making the latch circuits XDL unoccupied. To confirm whether or not the semiconductor memory device has entered the ready state like this, the memory controller transmits a command "70h" to the semiconductor memory device. In response to the receipt of the command "70h", the semiconductor memory device outputs status information to the memory controller. After confirming that the semiconductor memory device has entered the ready state based on the status information, the memory controller transmits a command set CSR to the semiconductor memory device to cause the semiconductor memory device which is executing the write operation WOx to execute a suspend read operation. The semiconductor memory device receives the command set CSR, suspends the write operation WOx being executed at, for example, a time when a program operation has been completed, and starts a read operation RO.

In this way, the semiconductor memory device according to the comparative example of the first modification of the first embodiment makes the memory controller wait from the start of the write operation WOx to entering the ready state through making the latch circuits XDL unoccupied. After confirming that the semiconductor memory device has entered the ready state using the command "70h", the memory controller transmits a command set CSR.

In contrast, in the semiconductor memory device 1 according to the first modification of the first embodiment, the memory controller 2 transmits a command set CSR to the semiconductor memory device 1 in response to the receipt of the read-ready information RR indicating that the semiconductor memory device 1 is in the read-ready state. That is, the memory controller 2 need not wait until the semiconductor memory device 1 makes the latch circuits XDL unoccupied and enter the ready state. The semiconductor memory device 1 receives the command set CSR, suspends the write operation WO, and starts the read operation RO. Accordingly, the semiconductor memory device 1 can cause the memory controller 2 to transmit a read operation-related command set earlier.

In addition, the semiconductor memory device 1 according to the first modification of the first embodiment may start a suspend read operation earlier, like the semiconductor memory device 1 according to the first embodiment.

(2) Second Modification

Figure 11:
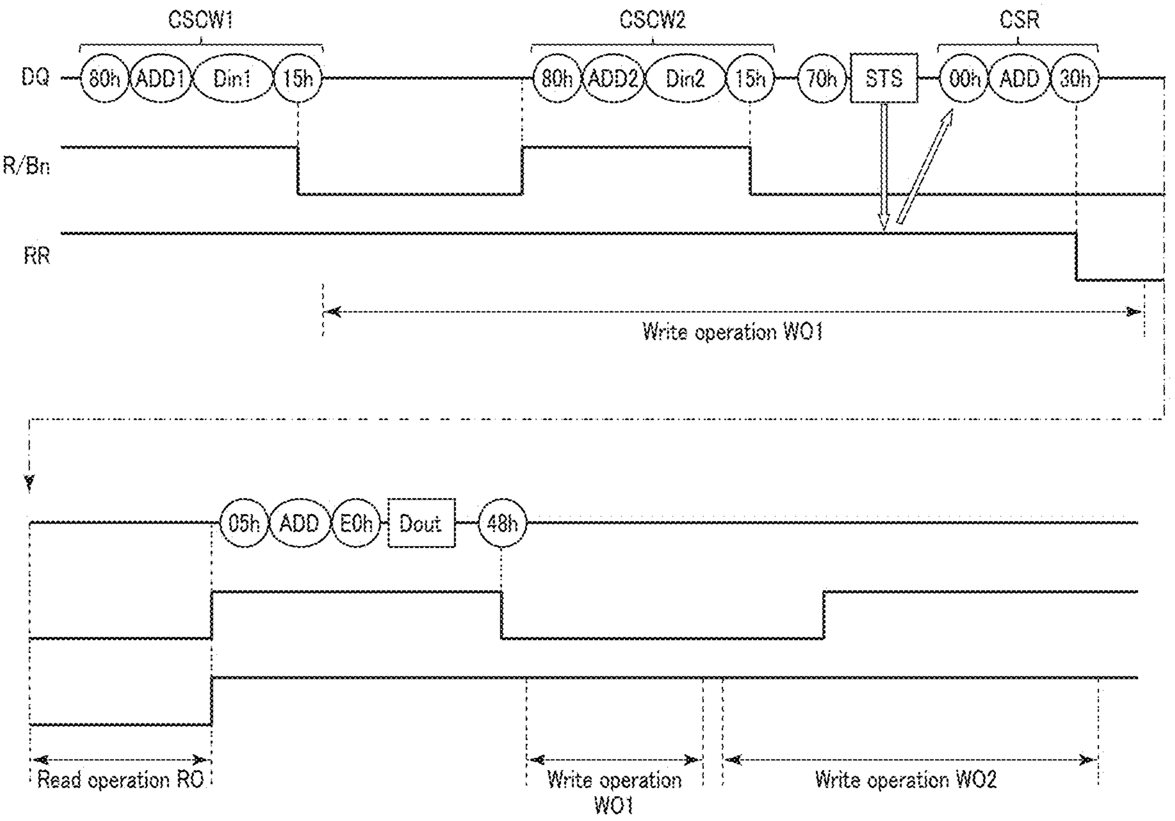
FIG. 11 shows an example of a timing chart showing command sequences, temporal changes of a ready/busy signal, and updates of read-ready information, which relate to a suspend read operation executed in a semiconductor memory device according to a second modification of the first embodiment.

FIG. 11 shows an example of a timing chart showing command sequences, temporal changes of the ready/busy signal R/Bn, and updates of the read-ready information RR relating to a suspend read operation executed in a semiconductor memory device 1 according to a second modification of the first embodiment. FIG. 11 shows an example of the case where the semiconductor memory device 1 sequentially accepts, for example, command sets related to SLC-mode write operations, and then accepts a command set related to a read operation. In the timing chart shown in FIG. 11, confirmation by the memory controller 2 using the command "70h" of whether or not the semiconductor memory device 1 has made the latch circuits XDL unoccupied and entered the ready state is omitted for ease of reference.

As in the example of FIG. 7, while the memory controller 2 is receiving the ready/busy signal R/Bn at the H level, i.e., while the semiconductor memory device 1 is in the ready state, the memory controller 2 generates a command set CSCW1 related to a write operation WO1 and transmits the command set CSCW1 to the semiconductor memory device 1. As in the example of FIG. 7, the semiconductor memory device 1 receives the command set CSCW1 and starts the write operation WO1.

In response to the receipt of the command "15h", the sequencer 17 causes the ready/busy controller 18 to transmit the ready/busy signal R/Bn to the memory controller 2 at the L level. The memory controller 2 is thereby notified that the semiconductor memory device 1 is in the busy state.

Subsequently, the sequencer 17 moves write data Din1 of the write operation WO1 from the latch circuits XDL to other latch circuits. The latch circuits XDL are thereby made unoccupied, and the sequencer 17 causes the ready/busy controller 18 to transmit the ready/busy signal R/Bn to the memory controller 2 at the H level. The memory controller 2 is thereby notified that the semiconductor memory device 1 is in the ready state.

While the semiconductor memory device 1 is executing the write operation WO1, the memory controller 2 generates a command set CSCW2 related to a write operation WO2 and transmits the command set CSCW2 to the semiconductor memory device 1. The semiconductor memory device 1 receives the command set CSCW2. The sequencer 17 inputs each bit of write data Din2 of the write operation WO2 to a latch circuit XDL corresponding to the area of the memory cell array 11 in which data is to be written. In response to the receipt of the command "15h", the sequencer 17 causes the ready/busy controller 18 to transmit the ready/busy signal R/Bn to the memory controller 2 at the L level. The memory controller 2 is thereby notified that the semiconductor memory device 1 is in the busy state. When the ready/busy signal R/Bn begins to be transmitted to the memory controller 2 at the L level like this, the semiconductor memory device 1 is executing the write operation WO1.

While the memory controller 2 is receiving the ready/busy signal R/Bn at the L level, i.e., while the semiconductor memory device 1 is in the busy state, the memory controller 2 receives, from the host device 4, a host command for causing the semiconductor memory device 1 to execute, for example, a high-priority read operation. The memory controller 2 may issue a command "70h" and transmit the command "70h" to the semiconductor memory device 1, and the semiconductor memory device 1 receives the command "70h".

In response to the receipt of the command "70h", the sequencer 17 causes the semiconductor memory device 1 to output the status information STS retained in the status register 151 to the memory controller 2. In the output of the status information STS, an H-level signal is output as read-ready information RR. The H-level signal indicates that the semiconductor memory device 1 is in the read-ready state.

As in the example of FIG. 7, the memory controller 2 generates a command set CSR and transmits the command set CSR to the semiconductor memory device 1, in response to the receipt of the read-ready information RR indicating that the semiconductor memory device 1 is in the read-ready state. The semiconductor memory device 1 accepts the command set CSR even though it is in the busy state, suspends the write operation WO1, and starts a read operation RO. Specifically, the sequencer 17 suspends the write operation WO1 being executed at a given time and makes at least one latch circuit (for example, the latch circuit ADL) of each sense amplifier unit SAU unoccupied. Then, the sequencer 17 starts a read operation RO. As in the example of FIG. 7, in response to the command "30h", the semiconductor memory device 1 enters the read-busy state.

In the suspension of the write operation WO1, the sequencer 17 may, for example, discard or save data Din2 retained in the latch circuits XDL to make the latch circuits XDL unoccupied, when the semiconductor memory device 1 accepts the command set CSR. Data Din2 is discarded, for example when the data Din2 cannot be moved from the latch circuits XDL to other latch circuits because the other latch circuits such as the latch circuits ADL, BDL, and CDL are used by the write operation WO1 being executed. If data Din2 is discarded, the memory controller 2 retransmits write data Din2 to the semiconductor memory device 1 in accordance with, for example, resumption of the suspended write operation WO1.

The operation from the start of the read operation RO to the output of read data Dout from the semiconductor memory device 1 to the memory controller 2 is the same as that in the example of FIG. 7.

After the output, the memory controller 2 issues a command "48h", and transmits the command "48h" to the semiconductor memory device 1. The semiconductor memory device 1 receives the command "48h". In response to the receipt of the command "48h", the sequencer 17 causes the ready/busy controller 18 to transmit the ready/busy signal R/Bn to the memory controller 2 at the L level. The memory controller 2 is thereby notified that the semiconductor memory device 1 is in the busy state. In response to the receipt of the command "48h", the sequencer 17 resumes the suspended write operation WO1.

The sequencer 17 executes the write operation WO2 subsequently to the write operation WO1. When the write operation WO1 is completed, and latch circuits such as the latch circuits ADL, BDL, and CDL become unoccupied, the sequencer 17 moves the bits retained in the latch circuits XDL of the data Din2 from the latch circuits XDL to other latch circuits. The latch circuits XDL are thereby made unoccupied, and the sequencer 17 causes the ready/busy controller 18 to transmit the ready/busy signal R/Bn to the memory controller 2 at the H level during the execution of the write operation WO2. The memory controller 2 is thereby notified that the semiconductor memory device 1 is in the ready state.

Described above is an example of the case where the semiconductor memory device 1 sequentially accepts, for example, command sets related to SLC-mode write operations, and then accepts a command set related to a read operation. However, write operation-related command sets accepted by the semiconductor memory device 1 are not limited to those. In, for example, an MLC-mode write operation, the semiconductor memory device 1 sequentially accepts the following page write command sets. The first command set includes, for example, a command "01h", a command "80h", address information ADD, write data Din, and a command "1Ah". The second command set includes, for example, a command "02h", a command "80h", address information ADD, write data Din, and a command "1Ah". The third command set includes, for example, a command "03h", a command "80h", address information ADD, write data Din, and a command "15h". The command "01h" is a command for designating the lower page. The command "02h" is a command for designating the middle page. The command "03h" is a command for designating the upper page. The command "1Ah" is a command used to cause the semiconductor memory device 1 to input each bit of data Din to a latch circuit XDL corresponding to an area of the memory cell array 11 in which data is to be written, based on the address information ADD and data Din received after the receipt of the command "80h". The command "1Ah" indicates that a write operation-related command set including a command for designating another page and the address information ADD follows. For example, at least one of the write operation-related command sets sequentially accepted by the semiconductor memory device 1 may be one of such page write command sets.

Figure 12:
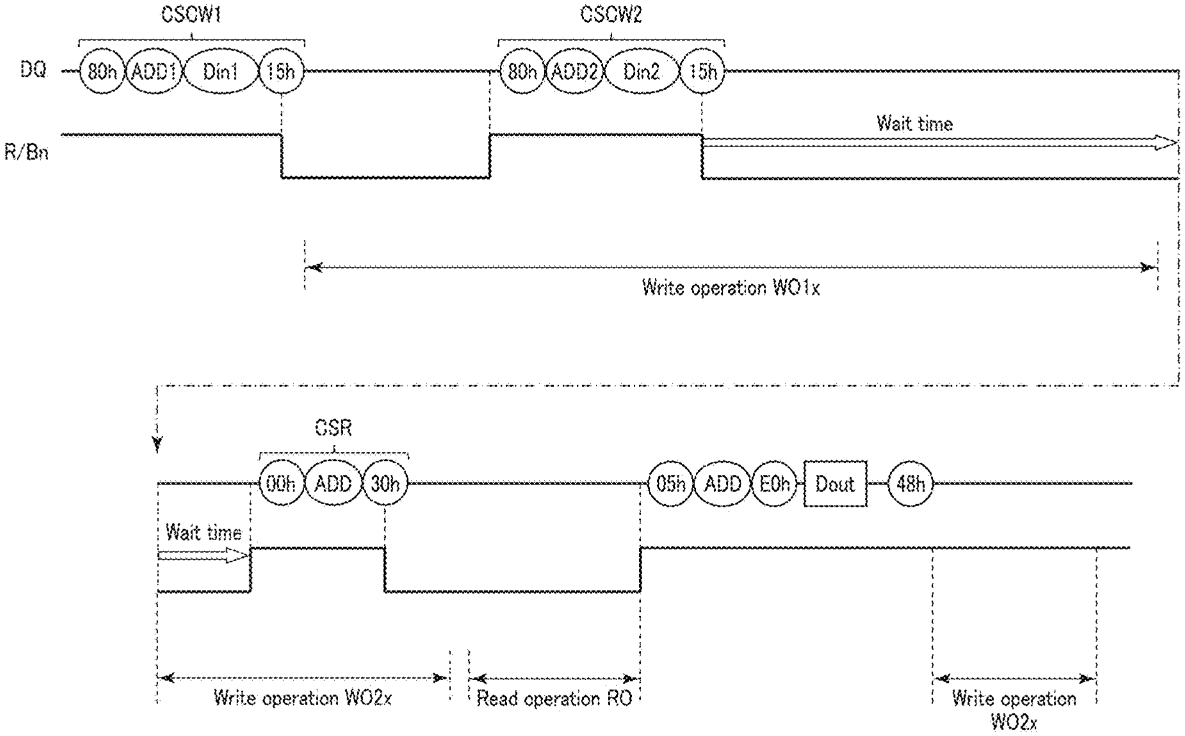
FIG. 12 shows an example of a timing chart showing command sequences and temporal changes of a ready/busy signal, which relate to a suspend read operation executed in a semiconductor memory device according to a comparative example of the second modification of the first embodiment.

FIG. 12 shows an example of a timing chart showing command sequences and temporal changes of the ready/busy signal R/Bn relating to a suspend read operation executed in a semiconductor memory device according to a comparative example of the second modification of the first embodiment. An example of the case where the write operation is executed as a cache program operation will be described.

The semiconductor memory device enters the busy state when starting the write operation WO1*x*, but enters the ready state after moving write data Din1 of the write operation WO1*x* from the latch circuits XDL to other latch circuits and thereby making the latch circuits XDL unoccupied. After the semiconductor memory device enters the ready state like this, the memory controller transmits a command set CSCW2 to the semiconductor memory device which is executing the write operation WO1*x*. The semiconductor memory device receives the command set CSCW2, inputs bits of write data Din2 of the write operation WO2*x* to the latch circuits XDL, and enters the busy state. Then, the semiconductor memory device completes the write operation WO1*x*, and starts the write operation WO2*x*. After starting the write operation WO2*x*, the semiconductor memory device moves data Din2 from the latch circuits XDL to other latch circuits, and thereby makes the latch circuits XDL unoccupied, and then enters the ready state.

After transmitting the command set CSCW2 to the semiconductor memory device, the memory controller waits until the semiconductor memory device enters the ready state as described above and transmits a command set CSR to the semiconductor memory device to cause the semiconductor memory device to execute a suspend read operation. The semiconductor memory device receives the command set CSR, suspends the write operation WO2*x* being executed at, for example, a time when a program operation has been completed, and starts a read operation RO.

In this way, the semiconductor memory device according to the comparative example of the second modification of the first embodiment makes the memory controller wait from the receipt of the command set CSCW2 to entering the ready state through making the latch circuits XDL unoccupied. After being notified that the semiconductor memory device has entered the ready state, the memory controller transmits a command set CSR.

In contrast, in the semiconductor memory device 1 according to the second modification of the first embodiment, the memory controller 2 transmits a command set CSR to the semiconductor memory device 1 in response to the receipt of the read-ready information RR indicating that the semiconductor memory device 1 is in the read-ready state. That is, the memory controller 2 need not wait until the semiconductor memory device 1 makes the latch circuits XDL unoccupied and enters the ready state. The semiconductor memory device 1 receives the command set CSR, suspends the write operation WO, and starts the read operation RO. Accordingly, the semiconductor memory device 1 can cause the memory controller 2 to transmit a read operation-related command set earlier.

The semiconductor memory device 1 according to the comparative example of the second modification of the first embodiment starts the write operation WO2*x* subsequently to the write operation WO1*x*, suspends the write operation WO2*x*, and executes the read operation RO. In contrast, the semiconductor memory device 1 according to the second modification of the first embodiment suspends the write operation WO1, and executes the read operation. Accordingly, the semiconductor memory device 1 according to the second modification of the first embodiment may start a suspend read operation earlier.

Second Embodiment

Hereinafter, a semiconductor memory device 1A according to a second embodiment will be described.

The write operation-related command set in the following description includes a command "XXh" at the head. Similarly, the read operation-related command set also includes a command "XXh" at the head. The command "XXh" is, for example, a command for designating a mode in which the semiconductor memory device 1A executes an operation specified by a subsequent command in the command set including the command "XXh". Such a command will also be referred to as a "prefix command" for ease of reference. The command "XXh" may be a command "A2h", for example. The command "A2h" is, for example, a command for causing the semiconductor memory device 1A to execute an operation specified by a subsequent command in the command set including the command "A2h" in the SLC mode.

Configuration Example

A configuration of the semiconductor memory device 1A according to the second embodiment will be described, focusing on differences from the configuration of the semiconductor memory device 1 according to the first embodiment.

Figure 13:
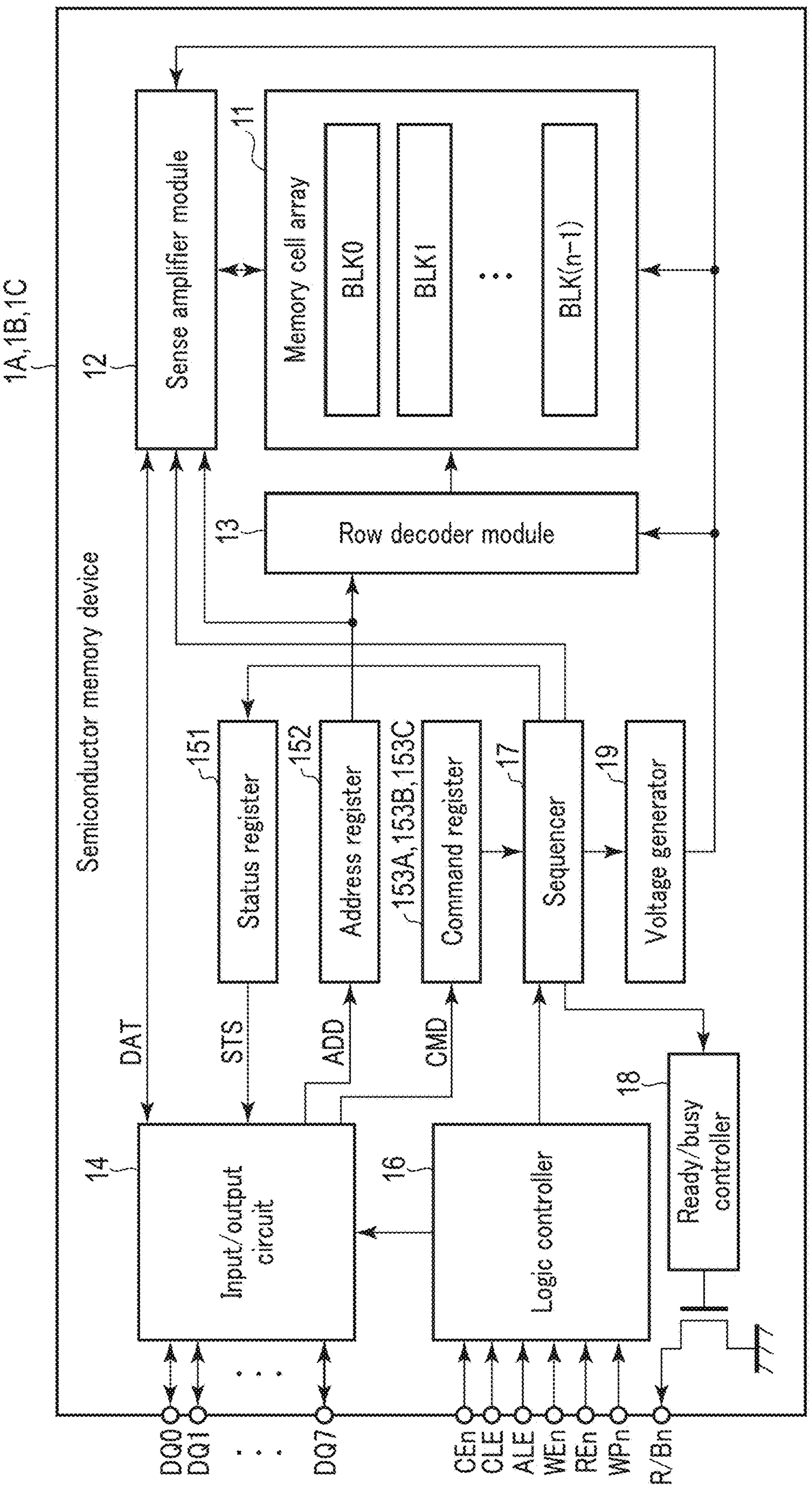
FIG. 13 is a block diagram showing an example of the configuration of a semiconductor memory device according to a second embodiment.

FIG. 13 is a block diagram showing an example of the configuration of the semiconductor memory device 1A according to the second embodiment. In FIG. 13, a command register included in the semiconductor memory device 1A is shown as a command register 153A for distinction from the command register 153 described in the first embodiment. The semiconductor memory device 1A may or may not have the configuration relating to the read-ready information RR described in the first embodiment. The reference symbols 1B, 1C, 153B, and 153C shown in FIG. 13 will be described in the subsequent embodiments.

Hereinafter, a configuration of the command register 153A will be described; however, part or the entirety of the configuration to be described below may be provided in another portion of the semiconductor memory device 1A, such as the sequencer 17.

Figure 14:
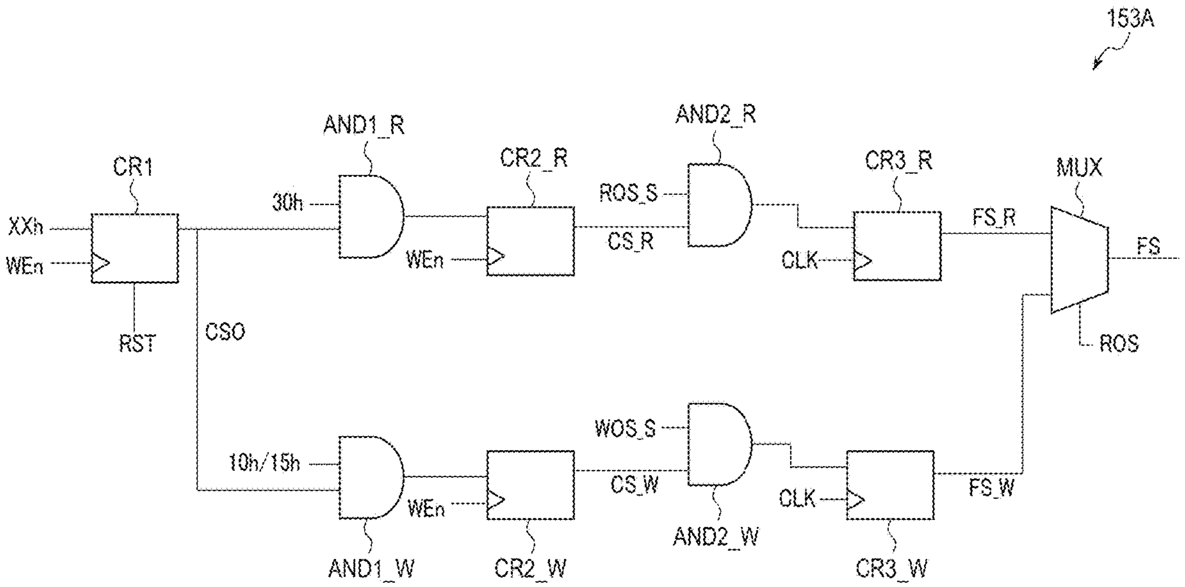
FIG. 14 shows an example of the circuit configuration of a command register of the semiconductor memory device according to the second embodiment.

FIG. 14 shows an example of the circuit configuration of the command register 153A of the semiconductor memory device 1A according to the second embodiment. As an example of the circuit configuration of the command register 153A, an example of the circuit configuration of a portion that receives a prefix command "XXh" and generates a signal FS based on the command "XXh" is shown.

The command register 153A includes register circuits CR1, CR2_W, CR2_R, CR3_W, and CR3_R, AND circuits AND1_W, AND1_R, AND2_W, and AND2_R, and a multiplexer circuit MUX.

In response to the receipt of a command "XXh" at the command register 153A, the command "XXh" is supplied to the register circuit CR1.

In response to the toggling of a write enable signal WEn, the register circuit CR1 receives and retains the supplied command "XXh". When the register circuit CR1 is not supplied with the command "XXh", the register circuit CR1 receives and retains data of L-level signals in response to the toggling of the write enable signal WEn. The register circuit CR1 outputs the retained data until another command "XXh" is latched or until a reset signal RST is supplied. In FIG. 14, data output from the register circuit CR1 is shown as data CSO.

The register circuit CR1 is supplied with a reset signal RST. The reset signal RST is generated by, for example, the sequencer 17. In response to the receipt of the H-level reset signal RST at the register circuit CR1, the signals of the bits of the data retained in the register circuit CR1 and those of the data CSO are brought to the L level. The other register circuits may be reset by being supplied with a reset signal in a similar manner, and the reset signal to be supplied may vary among the register circuits.

In response to the receipt of the command "10h" or command "15h" at the command register 153A, the received command "10h" or command "15h" is supplied to the AND circuit AND1_W.

The AND circuit AND1_W receives the data CSO via a first input unit, and receives the supplied command "10h" or command "15h" via a second input unit. The AND circuit AND1_W outputs an H-level signal on the output terminal when receiving the command "XXh" as the data CSO and receiving the command "10h" or command "15h", and outputs an L-level signal on the output terminal in the other cases.

In response to the toggling of the write enable signal WEn, the register circuit CR2_W receives and retains the signal output from the AND circuit AND1_W. The register circuit CR2_W outputs the retained signal on the output terminal. In FIG. 14, the signal output from the register circuit CR2_W is shown as a signal CS_W.

The AND circuit AND2_W receives the signal CS_W on a first input terminal, and receives a signal WOS_S on a second input terminal. The signal WOS_S is generated by, for example, the sequencer 17. Based on the receipt of, for example, at least one of the command "10h" and command "15h", the sequencer 17 generates the signal WOS_S at the H level. The AND circuit AND2_W performs an AND operation on the two signals received on the first input terminal and the second input terminal, and outputs a signal of a result of the operation on an output terminal.

In synchronization with a drop or a rise in a clock signal CLK, the register circuit CR3_W receives and retains the signal output from the AND circuit AND2_W. The register circuit CR3_W outputs the retained signal on an output terminal. In FIG. 14, the signal output from the register circuit CR3_W is shown as a signal FS_W.

The above-described circuit configuration from the register circuit CR1 to the register circuit CR3_W enables a transfer of signals relating to a command "XXh" when a write operation-related command set received by the semiconductor memory device 1A includes the command "XXh".

In response to the receipt of the command "30h" at the command register 153A, the command "30h" is supplied to the AND circuit AND1_R.

The AND circuit AND1_R receives the data CSO via a first input unit, and receives the supplied command "30h" via a second input unit. The AND circuit AND1_R outputs an H-level signal on the output terminal when receiving the command "XXh" as the data CSO and receiving the command "30h", and outputs an L-level signal on the output terminal in the other cases.

In response to the toggling of the write enable signal WEn, the register circuit CR2_R receives and retains the signal output from the AND circuit AND1_R. The register circuit CR2_R outputs the retained signal on an output terminal. In FIG. 14, the signal output from the register circuit CR2_R is shown as a signal CS_R.

The AND circuit AND2_R receives the signal CS_R on a first input terminal, and receives a signal ROS_S on a second input terminal. The signal ROS_S is generated by, for example, the sequencer 17. Based on the receipt of, for example, the command "30h", the sequencer 17 generates the signal ROS_S at the H level. The AND circuit AND2_R performs an AND operation on the two signals received on the first input terminal and the second input terminal, and outputs a signal of a result of the operation on an output terminal.

In synchronization with a drop or a rise of a clock signal CLK, the register circuit CR3_R receives and retains the signal output from the AND circuit AND2_R. The register circuit CR3_R outputs the retained signal on an output terminal. In FIG. 14, the signal output from the register circuit CR3_R is shown as a signal FS_R. The clock signal supplied to the register circuit CR3_R may be the same as or different from the clock signal supplied to the register circuit CR3_W.

The above-described circuit configuration from the register circuit CR1 to the register circuit CR3_R enables a transfer of signals relating to a command "XXh" when a read operation-related command set received by the semiconductor memory device 1A includes the command "XXh".

The multiplexer circuit MUX receives the signal FS_W on a first input terminal, and receives the signal FS_R on a second input terminal. The multiplexer circuit MUX receives a signal ROS as a select signal. The signal ROS is generated by, for example, the sequencer 17. Based on the receipt of, for example, the command "30h", the sequencer 17 generates the signal ROS at the H level. When the signal ROS is at the L level, the multiplexer circuit MUX outputs, on the output terminal, the signal received on the first input terminal, and when the signal ROS is at the H level, the multiplexer circuit MUX outputs, on the output terminal, the signal received on the second input terminal. That is, when receiving the L-level signal ROS while receiving the H-level signal FS_W on the first input terminal, the multiplexer circuit MUX outputs an H-level signal as a signal FS. Based on the H-level signal FS, the sequencer 17 executes a write operation in a mode designated by the prefix command "XXh". When receiving the H-level signal ROS while receiving the H-level signal FS_R on the second input terminal, the multiplexer circuit MUX outputs an H-level signal as the signal FS. Based on the H-level signal FS, the sequencer 17 executes a read operation in a mode designated by the prefix command "XXh". In accordance with completion of the read operation for example, the sequencer 17 brings the signal ROS from the H level to the L level.

Described below is an example of the case where the multiplexer circuit MUX is configured as described above; however, the present embodiment is not limited thereto. For example, the multiplexer circuit MUX may be configured to further receive a signal WOS as a select signal. The signal WOS is generated by, for example, the sequencer 17. Based on the receipt of, for example, at least one of the command "10h" and command "15h", the sequencer 17 generates the signal WOS at the H level. In this case, the multiplexer circuit MUX is configured to, for example, output, on the output terminal, the signal received on the first input terminal when the signal WOS is at the H level and output, on the output terminal, the signal received on the second input terminal when the signal ROS is at the H level. In this case, the multiplexer circuit MUX outputs an H-level signal as the signal FS when receiving the H-level signal WOS while receiving the H-level signal FS_W on the first input terminal. Based on the H-level signal FS, the sequencer 17 executes a write operation in a mode designated by the prefix command "XXh". In accordance with completion of the write operation for example, the sequencer 17 brings the signal WOS from the H level to the L level.

Operation Example

Hereinafter, an operation example relating to a suspend read operation executed in the semiconductor memory device 1A according to the second embodiment will be described in detail. Described below is an example of the case where a write operation is executed as the operation to be suspended; however, the present embodiment is not limited thereto. For example, the operation to be suspended may be an erase operation.

Hereinafter, an example of the case where a write operation is executed as a cache program operation will be described. Hereinafter, the case where a suspended write operation is resumed in response to a resume command such as a command "48h" will be described; however, the suspended write operation may be resumed with no need for the resume command.

Hereinafter, an example of the case where the memory controller 2 knows that the semiconductor memory device 1A is able to accept a read operation-related command set while being in the busy state will be described.

Figure 15:
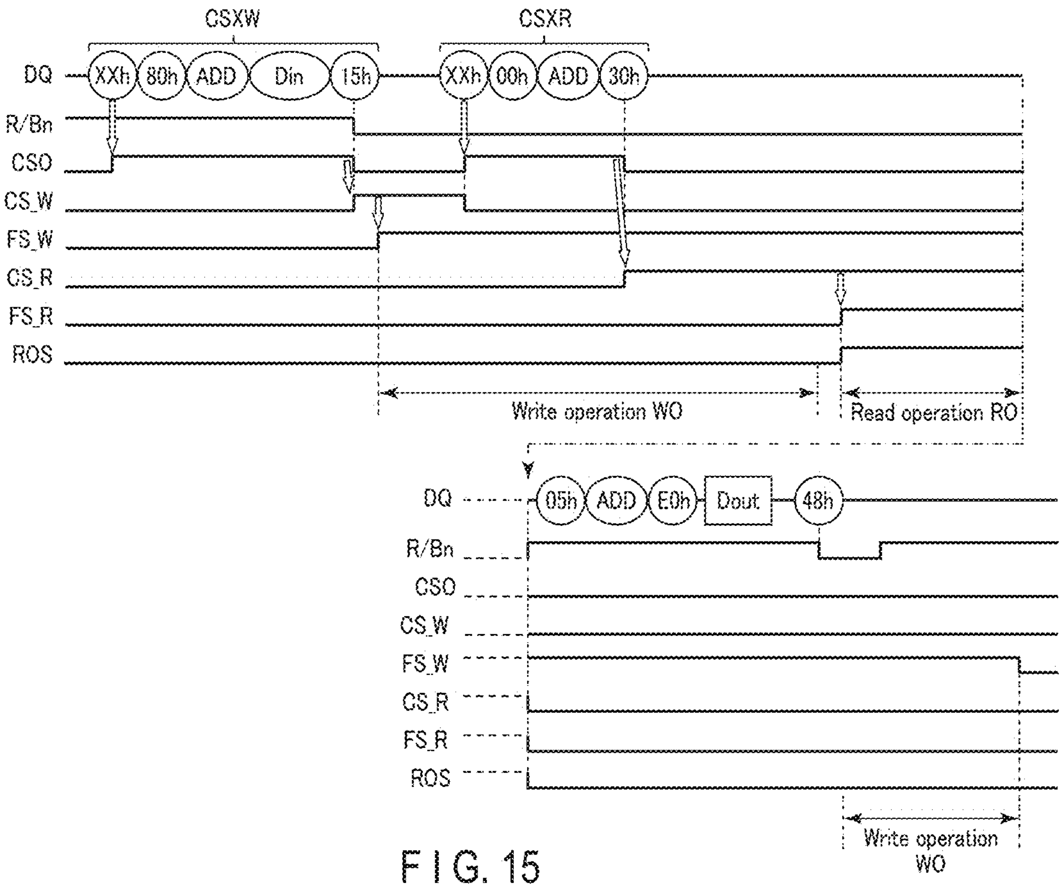
FIG. 15 shows an example of a timing chart showing command sequences, temporal changes of a ready/busy signal, and transfers of signals relating to a prefix command, which relate to a suspend read operation executed in the semiconductor memory device according to the second embodiment.

FIG. 15 shows an example of a timing chart showing command sequences, temporal changes of the ready/busy signal R/Bn, and transfers of signals relating to the prefix command "XXh" in the circuit configuration shown in FIG. 14, which relate to a suspend read operation executed in the semiconductor memory device 1A according to the second embodiment. In FIG. 15, a waveform relating to the data CSO is shown such that the waveform is at the H level when the command "XXh" is being transmitted by the data CSO, and at the L level in the other cases.

As in the example of FIG. 7, while the semiconductor memory device 1A is in the ready state, the memory controller 2 generates a command set CSXW related to a write operation WO and transmits the command set CSXW to the semiconductor memory device 1A. The command set CSXW includes a prefix command "XXh", a command "80h", address information ADD, write data Din, and a command "15h". For example, while transmitting the command set, the memory controller 2 transmits the write enable signal WEn to the semiconductor memory device 1A while periodically toggling the write enable signal WEn between the H level and the L level. Alternatively, for example, while transmitting each command or address information of the command set, the memory controller 2 transmits the write enable signal WEn to the semiconductor memory device 1A while periodically toggling the write enable signal WEn between the H level and the L level. The same applies to the subsequent drawings. As in the example of FIG. 7, the semiconductor memory device 1A receives the command set CSXW and starts a write operation WO. Details will be described below.

Before the memory controller 2 transmits the command set CSXW, signals of the bits of the data CSO are at the L level, and the signals CS_W, FS_W, CS_R, FS_R, and ROS are at the L level.

First, the memory controller 2 issues a command "XXh" and transmits the command "XXh" to the semiconductor memory device 1A. In response to the receipt of the command "XXh" at the command register 153A, the command "XXh" is supplied to the register circuit CR1. The register circuit CR1 receives and retains the command "XXh", and continues outputting the retained command "XXh" as the data CSO.

Subsequently, as in the example of FIG. 7, the memory controller 2 transmits a command "80h", address information ADD, data Din, and a command "15h" to the semiconductor memory device 1A.

In response to the receipt of the command "15h", the sequencer 17 causes the ready/busy controller 18 to transmit the ready/busy signal R/Bn to the memory controller 2 at the L level.

In response to the receipt of the command "15h" at the command register 153A, the command "15h" is supplied to the AND circuit AND1_W. The AND circuit AND1_W receives the command "15h" via the second input unit while receiving the command "XXh" via the first input unit. In response thereto, the AND circuit AND1_W outputs an H-level signal. The register circuit CR2_W receives and retains the H-level signal output from the AND circuit AND1_W, and outputs the signal CS_W at the same H-level as the retained signal.

Subsequently, in response to the receipt of the command "15h", the sequencer 17 supplies a reset signal RST to the register circuit CR1 at the H level for example. In response to the receipt of the H-level reset signal RST at the register circuit CR1, the signals of the bits of the data retained in the register circuit CR1 and those of the data CSO are brought to the L level.

Based on the data CSO, the AND circuit AND1_W outputs an L-level signal on the output terminal. However, upon receipt of the command "15h" at the semiconductor memory device 1A, the toggling of the write enable signal WEn immediately stops; therefore, the register circuit CR2_W does not retain the L-level signal. Accordingly, the signal CS_W is maintained at the H level.

Subsequently, based on the receipt of the command "15h", the sequencer 17 supplies the signal WOS_S to the AND circuit AND2_W at the H level. While receiving the H-level signal WOS_S on the second input terminal, the AND circuit AND2_W receives the H-level signal CS_W on the first input terminal. In response thereto, the AND circuit AND2_W outputs an H-level signal. The register circuit CR3_W receives and retains the H-level signal output from the AND circuit AND2_W, and outputs the signal FS_W at the same H-level as the retained signal. In response to the output of the H-level signal FS_W for example, the sequencer 17 brings the signal WOS_S from the H level to the L level.

The multiplexer circuit MUX receives the H-level signal FS_W on the first input terminal, and receives an L-level signal ROS as the select signal. In response to the receipt of the signal ROS at the L level, the multiplexer circuit MUX outputs, on the output terminal, the signal received on the first input terminal, i.e., the H-level signal FS_W. Accordingly, a signal FS based on the command "XXh" is output from the multiplexer circuit MUX at the H level. By receiving the H-level signal FS while the signal ROS is at the L level, the sequencer 17 starts a write operation wo in a mode designated by the prefix command "XXh". For example, in response to the start of the write operation wo in the mode designated by the prefix command "XXh", the semiconductor memory device 1A brings the signals of the interconnects transmitting the command "XXh", command "10h", and command "15h" to the L level.

While the semiconductor memory device 1A is in the busy state, the memory controller 2 receives, from the host device 4, a host command for causing the semiconductor memory device 1A to execute, for example, a high-priority read operation.

In response to the host command, the memory controller 2 generates a read operation-related command set CSXR and transmits the command set CSXR to the semiconductor memory device 1A, as in the example of FIG. 7. The command set CSXR includes a prefix command "XXh", a command "00h", address information ADD, and a command "30h". As in the example of FIG. 7, the semiconductor memory device 1A accepts the command set CSXR even though it is in the busy state, suspends the write operation WO, and starts a read operation RO. Details will be described below.

First, the memory controller 2 issues a command "XXh" and transmits the command "XXh" to the semiconductor memory device 1A. In response to the receipt of the command "XXh" at the command register 153A, the command "XXh" is supplied to the register circuit CR1. The register circuit CR1 receives and retains the command "XXh", and outputs the retained command "XXh" as the data CSO.

Here, the AND circuit AND1_W outputs an L-level signal as receiving neither the command "10h" nor the command "15h" via the second input unit. In response to the toggling of the write enable signal WEn, the register circuit CR2_W receives and retains the L-level signal output from the AND circuit AND1_W, and continues outputting the signal CS_W at the same L-level as the retained signal.

Subsequently, the memory controller 2 transmits a command "00h", address information ADD, and a command "30h" to the semiconductor memory device 1A, as in the example of FIG. 7.

In response to the receipt of the command "30h" at the command register 153A, the command "30h" is supplied to the AND circuit AND1_R. The AND circuit AND1_R receives the command "30h" via the second input unit while receiving the command "XXh" via the first input unit. In response thereto, the AND circuit AND1_R outputs an H-level signal. The register circuit CR2_R receives and retains the H-level signal output from the AND circuit AND1_R, and outputs the signal CS_R at the same H-level as the retained signal.

Subsequently, in response to the receipt of the command "30h", the sequencer 17 may supply a reset signal RST to the register circuit CR1 at the H level. In response to the receipt of the H-level reset signal RST at the register circuit CR1, the signals of the bits of the data retained in the register circuit CR1 and those of the data CSO are brought to the L level.

Based on the data CSO, the AND circuit AND1_R outputs an L-level signal on the output terminal. However, upon receipt of the command "30h" at the semiconductor memory device 1A, the toggling of the write enable signal WEn immediately stops; therefore, the register circuit CR2_R does not retain the L-level signal. Accordingly, the signal CS_R is maintained at the H level.

After the semiconductor memory device 1A accepts the command set CSXR, the sequencer 17 suspends the write operation wo being executed and makes at least one latch circuit (for example, the latch circuit ADL) of each sense amplifier unit SAU unoccupied, as in the example of FIG. 9. Then, the sequencer 17 starts a read operation RO. Details will be described below.

After suspending the write operation WO, the sequencer 17 supplies, based on the receipt of the command "30h", the signal ROS_S to the AND circuit AND2_R at the H level and the signal ROS to the multiplexer circuit MUX at the H level. While receiving the H-level signal ROS_S on the second input terminal, the AND circuit AND2_R receives the H-level signal CS_R on the first input terminal. In response thereto, the AND circuit AND2_R outputs an H-level signal. The register circuit CR3_R receives and retains the H-level signal output from the AND circuit AND2_R, and outputs the signal FS_R at the same H-level as the retained signal. In response to the output of the H-level signal FS_R for example, the sequencer 17 brings the signal ROS_S from the H level to the L level.

The multiplexer circuit MUX receives the H-level signal FS_R on the second input terminal, and receives the H-level signal ROS as the select signal. In response to the receipt of the signal ROS at the H level, the multiplexer circuit MUX outputs, on the output terminal, the signal received on the second input terminal, i.e., the H-level signal FS_R. Accordingly, a signal FS based on the command "XXh" is output from the multiplexer circuit MUX at the H level. By receiving the H-level signal FS while the signal ROS is at the H level, the sequencer 17 starts a read operation RO in a mode designated by the prefix command "XXh". For example, in response to the start of the read operation RO in the mode designated by the prefix command "XXh", the semiconductor memory device 1A brings the signals of the interconnects transmitting the command "XXh" and command "30h" to the L level.

In accordance with completion of the read operation RO, the semiconductor memory device 1A brings the signals CS_R, ROS, and FS_R to the L level.

The flow from the completion of the read operation RO to the resumption of the write operation wo is the same as that in the example of FIG. 9. As described in connection with the start of the write operation wo, a signal FS based on the command "XXh" is output from the multiplexer circuit MUX at the H level, based on the H-level signal FS_W and the L-level signal ROS. By receiving the H-level signal FS while the signal ROS is at the L level, the sequencer 17 resumes the write operation WO in the mode designated by the prefix command "XXh". In accordance with completion of the resumed write operation WO, the semiconductor memory device 1A brings the signal FS_W to the L level.

Described above is an example of the case where the memory controller 2 knows that the semiconductor memory device 1A is able to accept a read operation-related command set while being in the busy state. However, the present embodiment is not limited thereto. When the memory controller 2 does not know this, and the semiconductor memory device 1A has the configuration relating to the read-ready information RR as described in the first embodiment, the memory controller 2 may execute the inquiry using the command "70h" as described with reference to FIG. 7.

Described above is an example of the case where the semiconductor memory device 1A accepts a command set CSXR while being in the busy state after starting a write operation WO. As in the example of FIG. 10, the semiconductor memory device 1A may accept a command set CSXR after entering the ready state while executing a write operation WO. In this case, in response to the semiconductor memory device 1A entering the ready state, the sequencer 17 supplies a reset signal to the register circuit CR2_W, for example at the H level. In response to the receipt of the H-level reset signal at the register circuit CR2_W, the signal retained in the register circuit CR2_W and the signal CS_W are brought to the L level. Subsequently, upon receipt of the command set CSXR, the semiconductor memory device 1A operates in the same manner as in the example of FIG. 15 except for bringing the signal CS_W to the L level in response to the command "XXh". The case where, after entering the ready state in this way, the semiconductor memory device 1A receives a write operation-related command set including the prefix command "XXh", not the command set CSXR, will be described below. The semiconductor memory device 1A brings the signal CS_W to the H level again in response to the command "XXh", and executes the next write operation based on the H-level signal CS_W. This is similar to the semiconductor memory device 1A bringing the signal CS_R to the H level in response to the command "XXh" of the command set CSXR, and executing the read operation RO based on the H-level signal CS_R, in the example of FIG. 15.

Described above is an example of the case where the semiconductor memory device 1A executes a suspend read operation while executing a write operation as a cache program operation. However, the present embodiment is not limited thereto. For example, the semiconductor memory device 1A can execute a suspend read operation while executing a write operation as a normal program operation in the same manner as described above in detail. In this case, the flow is the same as the one described above in detail except that the command "10h" is used instead of the command "15h", the semiconductor memory device 1A is in the busy state after the resumption of the write operation until the completion of the write operation, and the time when the write operation is suspended may be different.

Described above is the case where the operation to be suspended is a write operation; however, the present embodiment is not limited thereto. In the case where the operation to be suspended is, for example, an erase operation, the command register 153A may be provided with a circuit configuration in which signals relating to a command "XXh" of an erase operation-related command set are transferred in a manner similar to the above-described one.

Advantageous Effects

Figure 16:
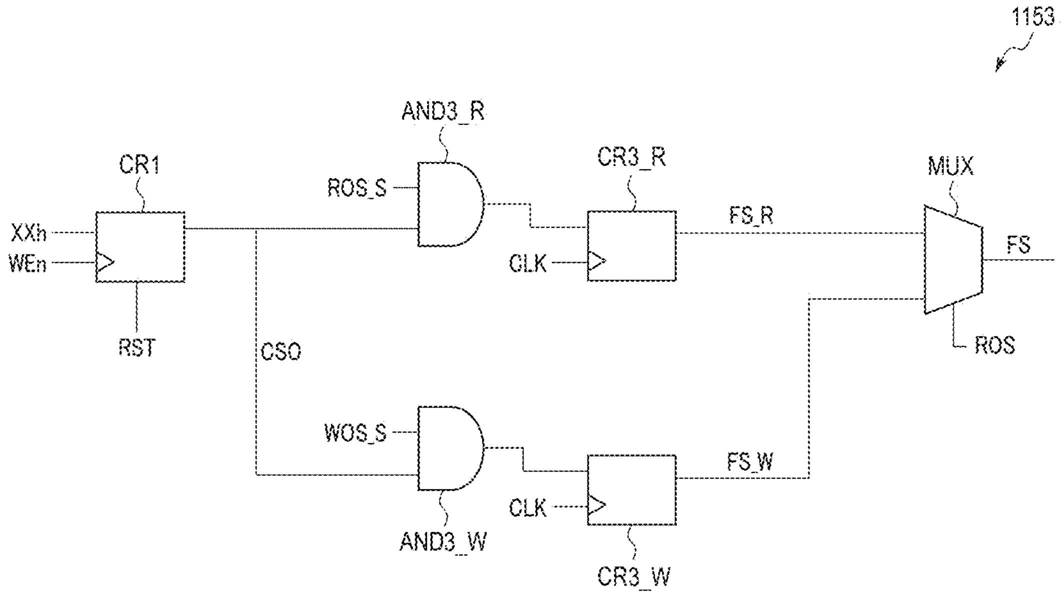
FIG. 16 shows an example of the circuit configuration of a command register of a semiconductor memory device according to a comparative example of the second embodiment.

FIG. 16 shows an example of the circuit configuration of a command register 1153 of a semiconductor memory device according to a comparative example of the second embodiment. The command register 1153 has a circuit configuration obtained by providing the circuit configuration of the command register 153A shown in FIG. 14 with AND circuits AND3_W and AND3_R instead of the register circuits CR2_W and CR2_R and AND circuits AND1_W, AND1_R, AND2_W, and AND2_R.

The AND circuit AND3_W receives data CSO and a signal WOS_S. The AND circuit AND3_W outputs an H-level signal on the output terminal when receiving a command "XXh" as the data CSO and receiving the signal WOS_S at the H level, and outputs an L-level signal on the output terminal in the other cases.

The AND circuit AND3_R receives data CSO and a signal ROS_S. The AND circuit AND3_R outputs an H-level signal on the output terminal when receiving a command "XXh" as the data CSO and receiving the ROS_S at the H level, and outputs an L-level signal on the output terminal in the other cases.

The register circuit CR3_W receives the signal output from the AND circuit AND3_W instead of the signal output from the AND circuit AND2_W in the case of the example of FIG. 14. The register circuit CR3_R receives the signal output from the AND circuit AND3_R instead of the signal output from the AND circuit AND2_R in the case of the example of FIG. 14.

Other than these points, the circuit configuration of the command register 1153 shown in FIG. 16 is the same as that of the command register 153A shown in FIG. 14.

Figure 17:
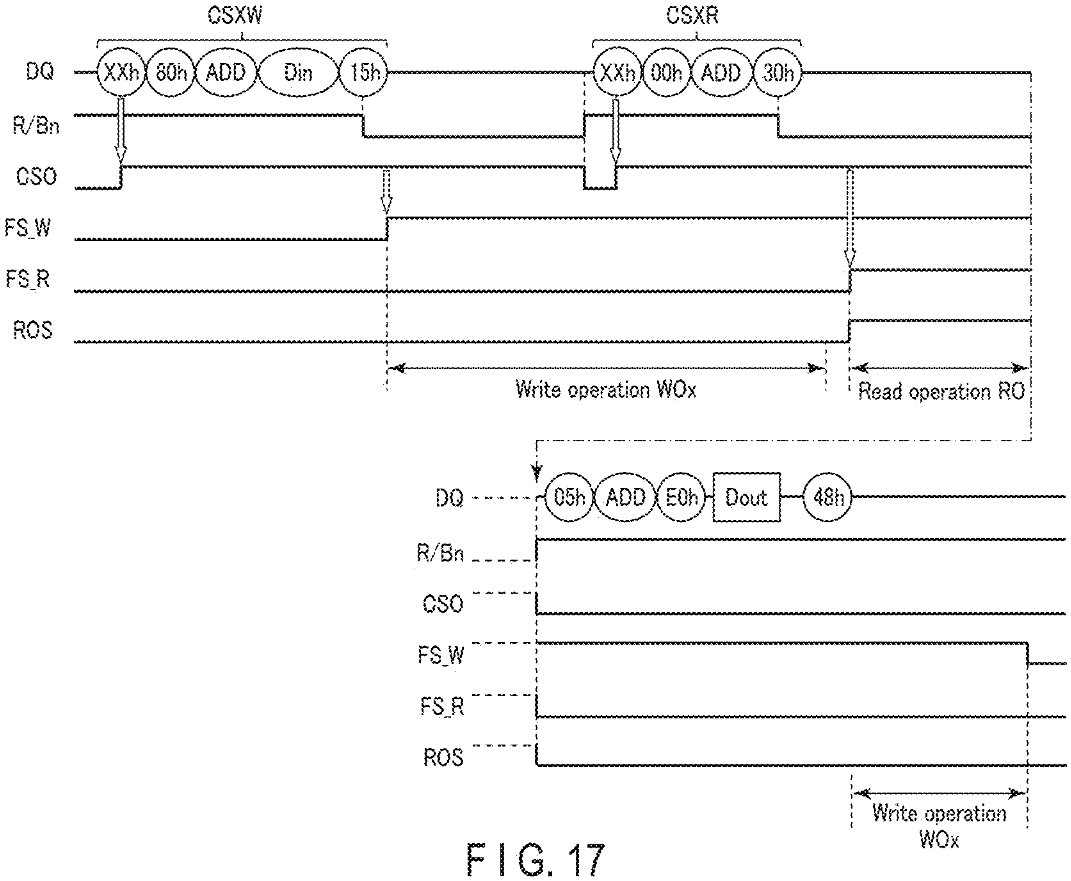
FIG. 17 shows an example of a timing chart showing command sequences, temporal changes of a ready/busy signal, and transfers of signals relating to a prefix command, which relate to a suspend read operation executed in the semiconductor memory device according to the comparative example of the second embodiment.

FIG. 17 shows an example of a timing chart showing command sequences, temporal changes of the ready/busy signal R/Bn, and transfers of signals relating to the prefix command "XXh" in the circuit configuration shown in FIG. 16, which relate to a suspend read operation executed in the semiconductor memory device according to the comparative example of the second embodiment. In the timing chart shown in FIG. 17, confirmation by the memory controller using the command "70h" of whether or not the semiconductor memory device has made the latch circuits XDL unoccupied and thereby entered the ready state is omitted for ease of reference.

The memory controller transmits a command set CSXW to the semiconductor memory device. In response to the receipt of the prefix command "XXh" at the semiconductor memory device, the register circuit CR1 retains the command "XXh", and outputs the command "XXh" as the data CSO. Then, based on the output command "XXh", the register circuit CR3_W outputs the signal FS_W at the H level. Based on the H-level signal FS_W, the semiconductor memory device starts a write operation WOx in a mode designated by the prefix command "XXh".

The semiconductor memory device enters the busy state when starting the write operation WOx, but enters the ready state after moving write data Din from the latch circuits XDL to other latch circuits and thereby making the latch circuits XDL unoccupied. In response to entering the ready state, the semiconductor memory device resets the register circuit CR1, and brings the signals of the bits of data retained in the register circuit CR1 and those of the data CSO to the L level.

The memory controller waits until the semiconductor memory device enters the ready state in this way, and then transmits a command set CSXR to the semiconductor memory device. In response to the receipt of the command "XXh" in the command set CSXR at the semiconductor memory device, the register circuit CR1 outputs the command "XXh" as the data CSO. Then, based on the output command "XXh", the register circuit CR3_R outputs the signal FS_R at the H level. The semiconductor memory device suspends the write operation WOx being executed, and starts a read operation RO in a mode designated by the prefix command "XXh", based on the H-level signal FS_R.

Let us consider the case where the memory controller transmits the command set CSXR to the semiconductor memory device without waiting as described above. In this case, the register circuit CR1, which already retains and is outputting the command "XXh", is supplied with the command "XXh" in the command set CSXR; as a result, the register circuit CR1 continues outputting the command "XXh". The semiconductor memory device may recognize that the command "XXh" output from the register circuit CR1 is based on the command set related to the write operation WOx being executed. Based on such recognition, the semiconductor memory device may not execute the read operation RO by the command set CSXR in the mode designated by the command "XXh".

To prevent such a malfunction, the semiconductor memory device according to the comparative example of the second embodiment causes the memory controller to wait until the semiconductor memory device enters the ready state and resets the register circuit CR1 as described above. After being notified that the semiconductor memory device has entered the ready state, the memory controller transmits the command set CSXR to the semiconductor memory device.

The semiconductor memory device 1A according to the second embodiment includes the register circuits CR2_W and CR2_R in addition to the register circuit CR1. In response to the receipt of the prefix command "XXh" at the semiconductor memory device 1A, the register circuit CR1 retains the command "XXh", and outputs the command "XXh" as the data CSO. Subsequently, a signal relating to the output command "XXh" is transmitted to and retained in one of the register circuit CR2_W and the register circuit CR2_R. For example, when the semiconductor memory device 1A receives the command set CSXW, a signal relating to the command "XXh" is transmitted to and retained in the register circuit CR2_W, based on the command "15h" and the write enable signal WEn. For example, when the semiconductor memory device 1A receives the command set CSXR, a signal relating to the command "XXh" is transmitted to and retained in the register circuit CR2_R, based on the command "30h" and the write enable signal WEn. After retaining the signal relating to the command "XXh" in the register circuit CR2_W or CR2_R, the semiconductor memory device 1A can reset the register circuit CR1. The time when the register circuit CR1 can be reset is earlier than the time when the semiconductor memory device 1A resets the register circuit CR1 after entering the ready state as described in connection with the comparative example of the second embodiment.

Therefore, when receiving the command set CSXR subsequently to the command set CSXW for example, the semiconductor memory device 1A according to the second embodiment resets the register circuit CR1 after the register circuit CR2_W retains the signal relating to the command "XXh", and may accept the command set CSXR thereafter. In response to, for example, the receipt of the command "15h" in the command set CSXW, the semiconductor memory device 1A resets the register circuit CR1. In such a case, the semiconductor memory device 1A may accept the command set CSXR immediately after receiving the command set CSXW. The semiconductor memory device 1A receives the command set CSXR, suspends the write operation WO, and starts the read operation RO. Accordingly, the semiconductor memory device 1A allows the memory controller 2 to transmit a read operation-related command set earlier.

In addition, the semiconductor memory device 1A according to the second embodiment may start a suspend read operation earlier, like the semiconductor memory device 1 according to the first embodiment.

Third Embodiment

A semiconductor memory device 1B according to a third embodiment will be described, focusing on differences from the semiconductor memory device 1A according to the second embodiment.

The write operation-related command set in the following description includes a prefix command "XXh" at the head. The read operation-related command set in the following description includes a command "ZZh" at the head, and includes a prefix command "XXh" subsequently to the command "ZZh". The command "ZZh" differs from the command "XXh". Hereinafter, the command "ZZh" will also be referred to as a prefix command "ZZh" for convenience.

As already shown in FIG. 13, the command register included in the semiconductor memory device 1B is referred to as a command register 153B for distinction from the command register 153 described in the first embodiment.

Figure 18:
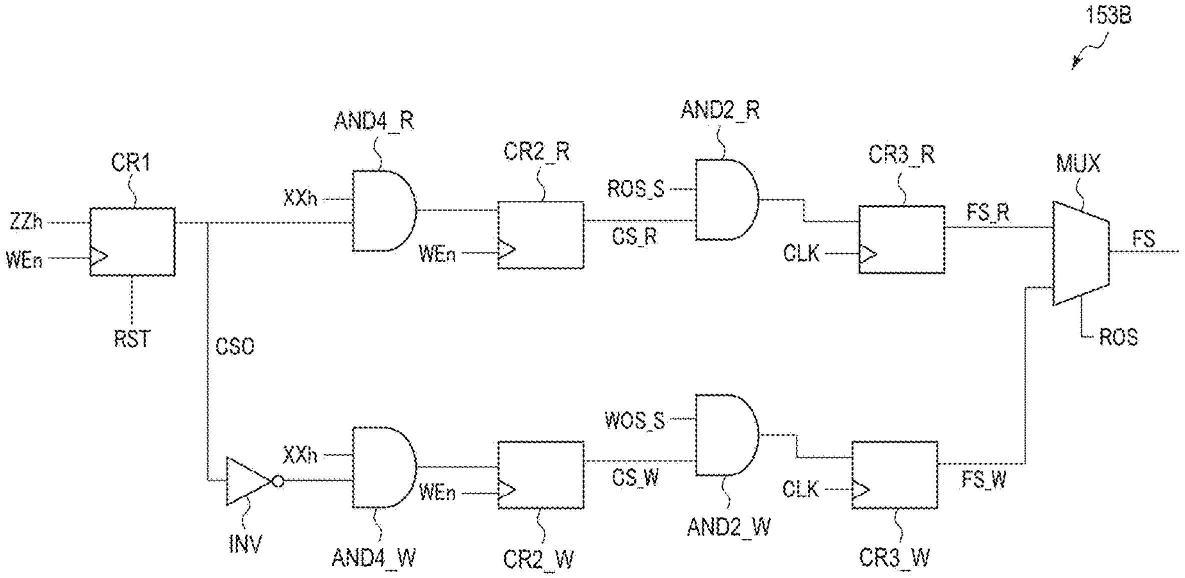
FIG. 18 shows an example of the circuit configuration of a command register of a semiconductor memory device according to a third embodiment.

FIG. 18 shows an example of the circuit configuration of the command register 153B of the semiconductor memory device 1B according to the third embodiment. As an example of the circuit configuration of the command register 153B, a portion that performs the same processing as the circuit configuration shown in FIG. 14 is shown.

The command register 153B has a circuit configuration obtained by providing the circuit configuration of the command register 153A shown in FIG. 14 with AND circuits AND4_W and AND4_R and an inverter INV instead of the AND circuits AND1_W and AND1_R.

In response to the receipt of the command "ZZh" at the command register 153B, the command "ZZh" is supplied to the register circuit CR1. In response to the toggling of the write enable signal WEn, the register circuit CR1 receives and retains the supplied command "ZZh". The register circuit CR1 outputs the retained data.

In response to the receipt of the command "XXh" at the command register 153B, the command "XXh" is supplied to the AND circuits AND4_W and AND4_R.

The AND circuit AND4_W receives, via a first input unit, data obtained by inverting data CSO via the inverter INV, and receives the supplied command "XXh" via a second input unit. The AND circuit AND4_W outputs an H-level signal on the output terminal when receiving, via the first input unit, data of H-level signals and receiving the command "XXh", and outputs an L-level signal on the output terminal in the other cases. The register circuit CR2_W receives the signal output from the AND circuit AND4_W instead of the signal output from the AND circuit AND1_W in the case of the example of FIG. 14.

The AND circuit AND4_R receives the data CSO via a first input unit, and receives the supplied command "XXh" via a second input unit. The AND circuit AND4_R outputs an H-level signal on the output terminal when receiving the command "ZZh" as the data CSO and receiving the command "XXh", and outputs an L-level signal on the output terminal in the other cases. The register circuit CR2_R receives the signal output from the AND circuit AND4_R instead of the signal output from the AND circuit AND1_R in the case of the example of FIG. 14.

Figure 19:
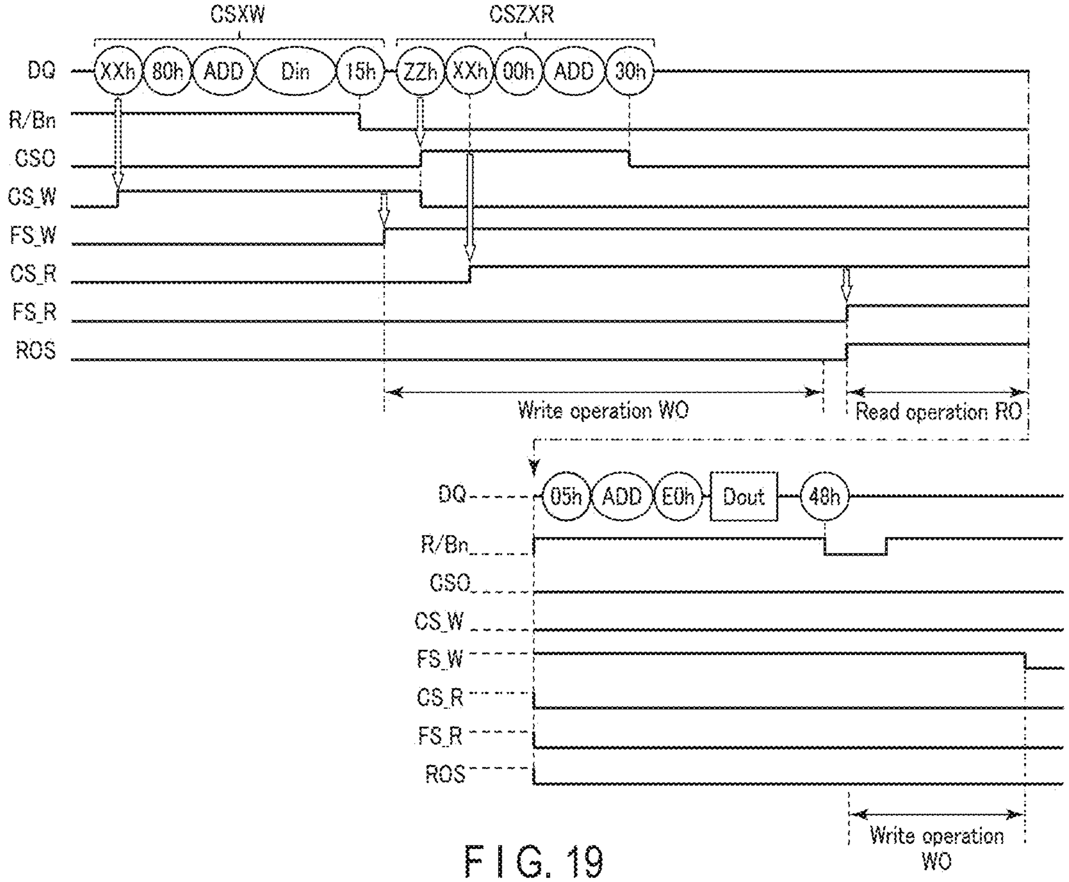
FIG. 19 shows an example of a timing chart showing command sequences, temporal changes of a ready/busy signal, and transfers of signals relating to a prefix command, which relate to a suspend read operation executed in the semiconductor memory device according to the third embodiment.

FIG. 19 shows an example of a timing chart showing command sequences, temporal changes of the ready/busy signal R/Bn, and transfers of signals relating to the prefix command "XXh" in the circuit configuration shown in FIG. 18, which relate to a suspend read operation executed in the semiconductor memory device 1B according to the third embodiment. In FIG. 19, a waveform relating to the data CSO is shown such that the waveform is at the H level when the command "ZZh" is being transmitted by the data CSO, and at the L level in the other cases.

Regarding the timing chart shown in FIG. 19, points different from the example of FIG. 15 will be described.

The operation in which the semiconductor memory device 1B receives the command set CSXW and starts the write operation WO is the same as that in the example of FIG. 15 except for the points to be described below.

Since the command register 153B is not in receipt of the command "ZZh", data of L-level signals are supplied to the register circuit CR1. The register circuit CR1 receives and retains the data, and outputs the retained data of L-level signals as the data CSO. In response to the receipt of the command "XXh" at the command register 153B, the command "XXh" is supplied to the AND circuit AND4_W. The AND circuit AND4_W receives the command "XXh" via the second input unit while receiving, via the first input unit, data of H-level signals, which is data obtained by inverting the data CSO via the inverter INV. In response thereto, the AND circuit AND4_W outputs an H-level signal. The register circuit CR2_W receives and retains the H-level signal output from the AND circuit AND4_W, and outputs the signal CS_W at the same H-level as the retained signal.

Resetting of the register circuit CR1 in response to the command "15h" as described with reference to FIG. 15 may or may not be executed in the example of FIG. 19.

The operation in which the semiconductor memory device 1B receives a command set CSZXR instead of the command set CSXR, suspends the write operation wo, and starts the read operation RO, is the same as that in the example of FIG. 15 except for the points to be described below. The command set CSZXR differs from the command set CSXR in terms of additionally including the prefix command "ZZh" before the command set CSXR.

The memory controller 2 issues a command "ZZh" and transmits the command "ZZh" to the semiconductor memory device 1B. In response to the receipt of the command "ZZh" at the command register 153B, the command "ZZh" is supplied to the register circuit CR1. The register circuit CR1 receives and retains the command "ZZh", and outputs the command "ZZh" as the data CSO.

Here, the AND circuit AND4_W is outputting an L-level signal as receiving at least one L-level signal via the first input unit. In response to the toggling of the write enable signal WEn, the register circuit CR2_W receives and retains the L-level signal output from the AND circuit AND4_W, and outputs the signal CS_W at the same L-level as the retained signal.

Subsequently, in response to the receipt of the command "XXh" at the command register 153B, the command "XXh" is supplied to the AND circuit AND4_R. The AND circuit AND4_R receives the command "XXh" via the second input unit while receiving, via the first input unit, the command "ZZh" as the data CSO. In response thereto, the AND circuit AND4_R outputs an H-level signal. The register circuit CR2_R receives and retains the H-level signal output from the AND circuit AND4_R, and outputs the signal CS_R at the same H-level as the retained signal.

As in the example of FIG. 15, in response to the receipt of the command "30h" at the semiconductor memory device 1B, the signals of the bits of the data retained in the register circuit CR1 and those of the data CSO may be brought to the L level. Based on the data CSO, the AND circuit AND4_R outputs an L-level signal on the output terminal. However, upon receipt of the command "30h" at the semiconductor memory device 1B, the toggling of the write enable signal WEn immediately stops; therefore, the register circuit CR2_R does not retain the L-level signal. Accordingly, the signal CS_R is maintained at the H level.

As in the example of FIG. 15, in response to the start of the read operation RO for example, the semiconductor memory device 1B brings the signals of the interconnects transmitting the command "ZZh" to the L level.

The operation after the semiconductor memory device 1B starts the read operation RO is the same as that in the example of FIG. 15.

Described above is the case where the write operation-related command set includes the prefix command "XXh", and the read operation-related command set includes the prefix command "XXh" subsequently to the prefix command "ZZh". The present embodiment is not limited thereto. The present embodiment can be applied to, for example, the case where the write operation-related command set includes the prefix command "XXh" subsequently to the prefix command "ZZh", and the read operation-related command set includes the prefix command "XXh". In this case, the command register 153B may be modified so that the AND circuit AND4_W receives data CSO and the AND circuit AND4_R receives data obtained by inverting data CSO via the inverter INV, instead of the AND circuit AND4_W receiving data obtained by inverting data CSO via the inverter INV and the AND circuit AND4_R receiving data CSO as in the example of FIG. 18.

Accordingly, the semiconductor memory device 1B according to the third embodiment produces the same advantageous effects as those described in the second embodiment.

Fourth Embodiment

A semiconductor memory device 1C according to a fourth embodiment will be described, focusing on differences from the semiconductor memory device 1A according to the second embodiment.

The write operation-related command set in the following description includes a prefix command "XXh" at the head. Similarly, the read operation-related command set in the following description includes a prefix command "YYh" at the head. The command "YYh" differs from the command "XXh". The command "YYh" is also, for example, a command for designating a mode in which the semiconductor memory device 1C executes an operation specified by a subsequent command in the command set including the command "YYh". The mode designated by the command "YYh" is, for example, the same as the mode designated by the command "XXh".

As already shown in FIG. 13, the command register included in the semiconductor memory device 1C will be referred to as a command register 153C for distinction from the command register 153 described in the first embodiment.

Figure 20:
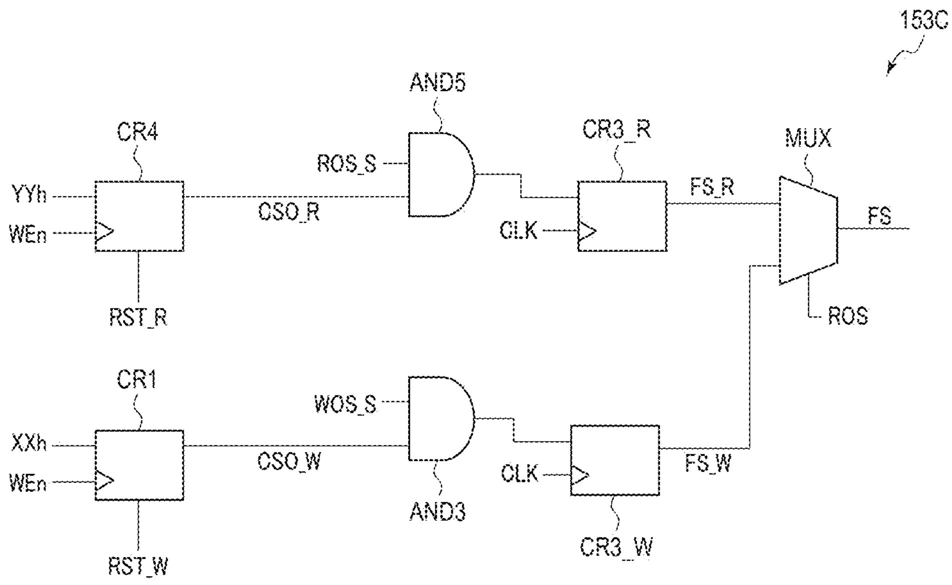
FIG. 20 shows an example of the circuit configuration of a command register of a semiconductor memory device according to a fourth embodiment.

FIG. 20 shows an example of the circuit configuration of the command register 153C of the semiconductor memory device 1C according to the fourth embodiment. As an example of the circuit configuration of the command register 153C, a portion that performs the same processing as the circuit configuration shown in FIG. 14 is shown.

The command register 153C has a circuit configuration obtained by providing the circuit configuration of the command register 153A shown in FIG. 14 with a register circuit CR4 and AND circuits AND3 and AND5 instead of the register circuits CR2_W and CR2_R and AND circuits AND1_W, AND1_R, AND2_W, and AND2_R.

In FIG. 20, data output from the register circuit CR1 is shown as data CSO_W, and the reset signal supplied to the register circuit CR1 is shown as a reset signal RST W.

The AND circuit AND3 receives data CSO_W via a first input unit, and receives a signal WOS_S via a second input unit. The AND circuit AND3 outputs an H-level signal on an output terminal when receiving the command "XXh" as the data CSO_W and receiving the signal WOS_S at the H level, and outputs an L-level signal on the output terminal in the other cases. The register circuit CR3_W receives the signal output from the AND circuit AND3, instead of the signal output from the AND circuit AND2_W in the case of the example of FIG. 14.

The above-described circuit configuration from the register circuit CR1 to the register circuit CR3_W enables a transfer of signals relating to a command "XXh" when the write operation-related command set received by the semiconductor memory device 1C includes the command "XXh".

In response to the receipt of the command "YYh" at the command register 153C, the command "YYh" is supplied to the register circuit CR4.

In response to the toggling of the write enable signal WEn, the register circuit CR4 receives and retains the supplied command "YYh". The register circuit CR4 outputs the retained data. In FIG. 20, data output from the register circuit CR4 is shown as data CSO_R. The register circuit CR4 is supplied with a reset signal RST_R. The reset signal RST_R may be a signal different from the reset signal RST W. The reset signal RST_R is generated by, for example, the sequencer 17. In response to the receipt of the H-level reset signal RST_R at the register circuit CR4, the signals of the bits of the data retained in the register circuit CR4 and those of the data CSO_R are brought to the L level.

The AND circuit AND5 receives data CSO_R via a first input unit, and receives a signal ROS_S via a second input unit. The AND circuit AND5 outputs an H-level signal on an output terminal when receiving the command "YYh" as the data CSO_R and receiving the signal ROS_S at the H level, and outputs an L-level signal on the output terminal in the other cases. The register circuit CR3_R receives the signal output from the AND circuit AND5, instead of the signal output from the AND circuit AND2_R in the case of the example of FIG. 14.

Figure 21:
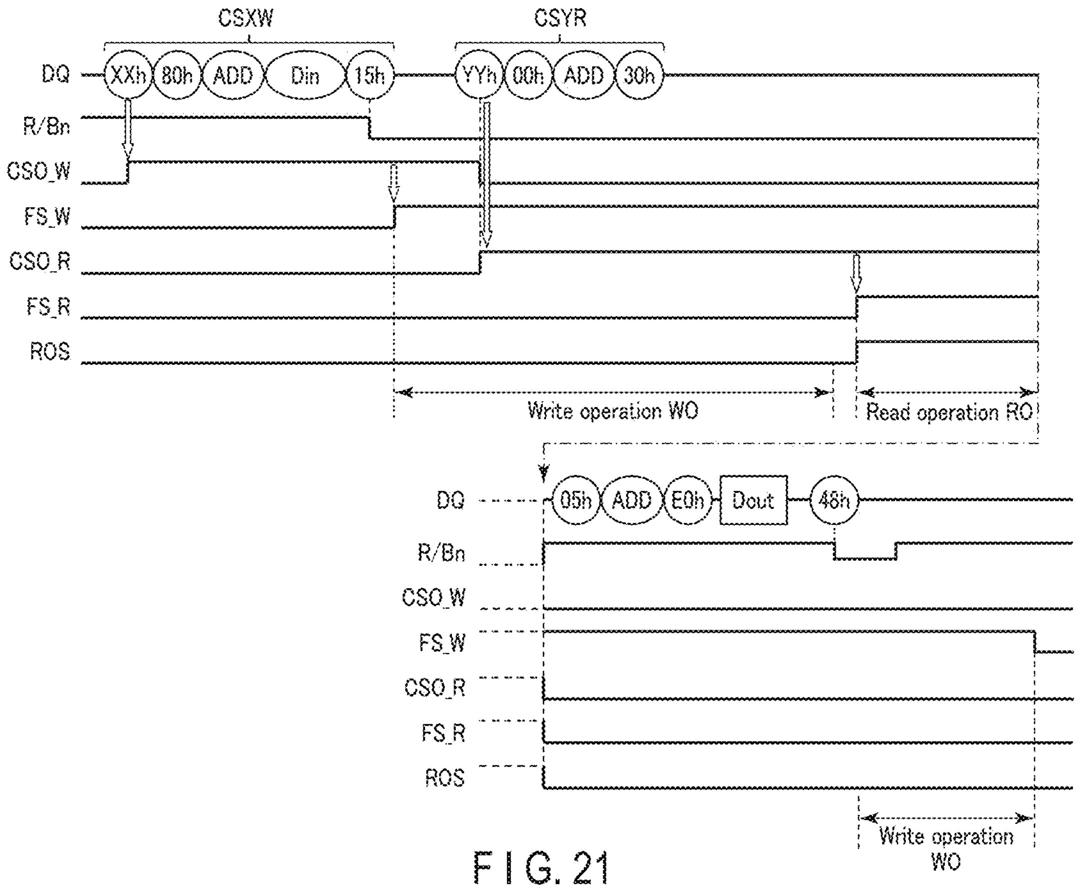
FIG. 21 shows an example of a timing chart showing command sequences, temporal changes of a ready/busy signal, and transfers of signals relating to a prefix command and signals relating to another prefix command, which relate to a suspend read operation executed in the semiconductor memory device according to the fourth embodiment.

The above-described circuit configuration from the register circuit CR4 to the register circuit CR3_R enables a transfer of signals relating to a command "YYh" when the read operation-related command set received by the semiconductor memory device 1C includes the command "YYh". FIG. 21 shows an example of a timing chart showing command sequences, temporal changes of the ready/busy signal R/Bn, and transfers of signals relating to the prefix command "XXh" and signals relating to the prefix command "YYh" in the circuit configuration shown in FIG. 20, which relate to a suspend read operation executed in the semiconductor memory device 1C according to the fourth embodiment. In FIG. 21, a waveform relating to the data CSO_W is shown such that the waveform is at the H level when the command "XXh" is being transmitted by the data CSO_W, and at the L level in the other cases. In FIG. 21, a waveform relating to the data CSO_R is shown such that the waveform is at the H level when the command "YYh" is being transmitted by the data CSO_R, and at the L level in the other cases. In the example of FIG. 21, waveforms relating to the data CSO_W and CSO_R are shown instead of the waveform relating to the data CSO and waveforms of the signals CS_W and CS_R in the example of FIG. 15.

Regarding the timing chart shown in FIG. 21, points different from the example of FIG. 15 will be described.

The operation in which the semiconductor memory device 1C receives the command set CSXW and starts the write operation WO is the same as that in the example of FIG. 15 except for the points to be described below.

As in the example of FIG. 15, in response to the receipt of the command "XXh" at the command register 153C, the register circuit CR1 receives and retains the command "XXh". The register circuit CR1 outputs the retained command "XXh" as data CSO_W.

Resetting of the register circuit CR1 in response to the command "15h" as described with reference to FIG. 15 is not executed in the example of FIG. 21.

Subsequently, based on the receipt of the command "15h", the sequencer 17 supplies the signal WOS_S to the AND circuit AND3 at the H level. While receiving the H-level signal WOS_S via the second input unit, the AND circuit AND3 receives the command "XXh" as the data CSO_W via the first input unit. In response thereto, the AND circuit AND3 outputs an H-level signal. The register circuit CR3_W receives and retains the H-level signal output from the AND circuit AND3, and outputs the signal FS_W at the same H-level as the retained signal.

As in the example of FIG. 15, in response to the start of the write operation WO for example, the semiconductor memory device 1C brings the signals of the interconnects transmitting the command "XXh" to the L level.

The operation in which the semiconductor memory device 1C receives, instead of the command set CSXR, a command set CSYR, which is obtained by replacing the prefix command "XXh" of the command set CSXR with the prefix command "YYh", suspends the write operation wo, and starts the read operation RO is the same as that in the example of FIG. 15 except for the points to be described below.

The memory controller 2 issues a command "YYh" and transmits the command "YYh" to the semiconductor memory device 1C. In response to the receipt of the command "YYh" at the command register 153C, the command "YYh" is supplied to the register circuit CR4. The register circuit CR4 receives and retains the command "YYh", and outputs the command "YYh" as the data CSO_R.

Since the signals of the interconnects transmitting the command "XXh" are at the L level, the register circuit CR1 outputs data of L-level signals as the data CSO_W.

Resetting of the register circuit CR4 in response to the command "30h" as described with reference to FIG. 15 is not executed in the example of FIG. 21.

Subsequently, based on the receipt of the command "30h", the sequencer 17 supplies the signal ROS_S to the AND circuit AND5 at the H level. While receiving the H-level signal ROS_S via the second input unit, the AND circuit AND5 receives, via the first input unit, the command "YYh" as the data CSO_R. In response thereto, the AND circuit AND5 outputs an H-level signal. The register circuit CR3_R receives and retains the H-level signal output from the AND circuit AND5, and outputs the signal FS_R at the same H-level as the retained signal.

As in the example of FIG. 15, in response to the start of the read operation RO for example, the semiconductor memory device 1C brings the signals of the interconnects transmitting the command "YYh" to the L level.

The operation after the semiconductor memory device 1C starts the read operation RO is the same as that in the example of FIG. 15 except that the signals of the bits of the data CSO_R are brought to the L level, instead of the signal CS_R being brought to the L level, in accordance with completion of the read operation RO.

Accordingly, the semiconductor memory device 1C according to the fourth embodiment produces the same advantageous effects as those described in the second embodiment.

Other Embodiments

Modifications applicable to each of the second embodiment, third embodiment, and fourth embodiment will be described. Hereinafter, the second embodiment will be taken as an example.

The write operation-related command set in the following description includes a prefix command "XXh" at the head. Similarly, the read operation-related command set in the following description includes a prefix command "WWh" at the head. The command "WWh" differs from the command "XXh". The command "WWh" is also, for example, a command for designating a mode in which the semiconductor memory device executes an operation specified by a subsequent command in the command set including the command "WWh". The mode designated by the command "WWh" is, for example, different from the mode designated by the command "XXh". The command "WWh" may be, for example, the command "01h" described in the first embodiment.

Figure 22:
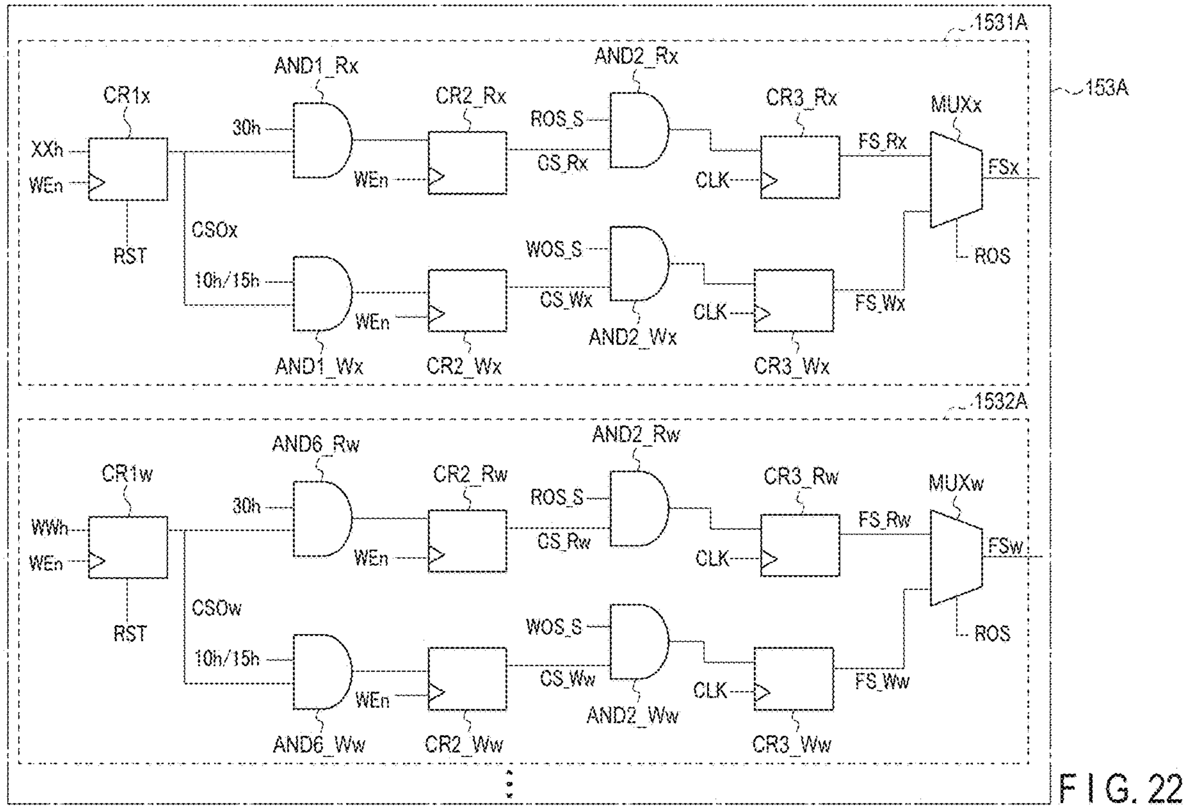
FIG. 22 shows an example of the circuit configuration of a command register of a semiconductor memory device according to a modification of the second embodiment.

FIG. 22 shows an example of the circuit configuration of a command register 153A of a semiconductor memory device 1A according to a modification of the second embodiment. As an example of the circuit configuration of the command register 153A, an example of the circuit configuration of a portion that receives a prefix command "WWh" and generates a signal FSw based on the command "WWh" in addition to the circuit configuration shown in FIG. 14 is shown.

The command register 153A shown in FIG. 22 includes a first command processing circuit 1531A and a second command processing circuit 1532A.

The first command processing circuit 1531A has the circuit configuration shown in FIG. 14. For distinction from the second command processing circuit 1532A, each register circuit, each AND circuit, and a multiplexer circuit included in the circuit configuration, and output data and output signals from these circuits will be accompanied by a suffix x at the end of their reference symbols.

The second command processing circuit 1532A has a circuit configuration obtained by providing the circuit configuration of the first command processing circuit 1531A with AND circuits AND6_Ww and AND6_Rw instead of AND circuits AND1_Wx and AND1_Rx. Each register circuit, each AND circuit, and a multiplexer circuit included in the circuit configuration, and output data and output signals from these circuits, are accompanied by a suffix w at the end of their reference symbols.

In response to the receipt of the command "WWh" at the command register 153A, the command "WWh" is supplied to the register circuit CR1*w*. In response to the toggling of the write enable signal WEn, the register circuit CR1*w* receives and retains the supplied command "WWh". The register circuit CR1*w* outputs the retained data as data CSOw.

In response to the receipt of the command "10h" or command "15h" at the command register 153A, the received command "10h" or command "15h" is supplied to the AND circuit AND6_Ww.

The AND circuit AND6_Ww receives the data CSOw via a first input unit, and receives the supplied command "10h" or command "15h" via a second input unit. The AND circuit AND6_Ww outputs an H-level signal on an output terminal when receiving the command "WWh" as the data CSOw and receiving the command "10h" or command "15h", and outputs an L-level signal on the output terminal in the other cases.

In response to the receipt of the command "30h" at the command register 153A, the command "30h" is supplied to the AND circuit AND6_Rw.

The AND circuit AND6_Rw receives the data CSOw via a first input unit, and receives the supplied command "30h" via a second input unit. The AND circuit AND6_Rw outputs an H-level signal on an output terminal when receiving the command "WWh" as the data CSOw and receiving the command "30h", and outputs an L-level signal on the output terminal in the other cases.

The register circuit CR2_Ww receives the signal output from the AND circuit AND6_Ww, instead of the signal output from the AND circuit AND1_Wx in the case of the first command processing circuit 1531A. The register circuit CR2_Rw receives the signal output from the AND circuit AND6_Rw, instead of the signal output from the AND circuit AND1_Rx in the case of the first command processing circuit 1531A.

Other than these points, the circuit configuration of the second command processing circuit 1532A is the same as that of the first command processing circuit 1531A.

In a similar manner to the manner described with reference to FIG. 14, when receiving the L-level signal ROS while receiving the H-level signal FS_Ww on a first input terminal, the multiplexer circuit MUXw outputs an H-level signal as the signal FSw. Based on the H-level signal FSw, the sequencer 17 executes a write operation in a mode designated by the prefix command "WWh". When receiving the H-level signal ROS while receiving the H-level signal FS_Rw on a second input terminal, the multiplexer circuit MUXw outputs an H-level signal as the signal FSw. Based on the H-level signal FSw, the sequencer 17 executes a read operation in a mode designated by the prefix command "WWh".

Figure 23:
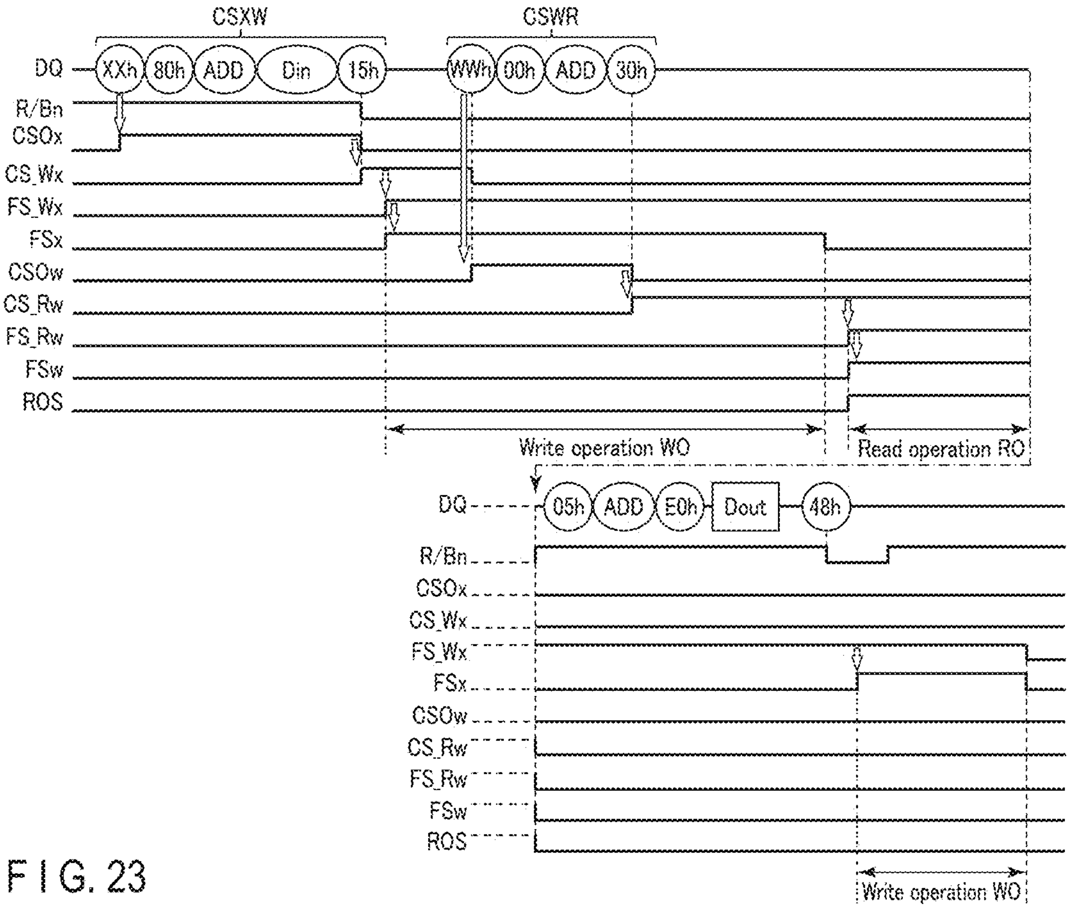
FIG. 23 shows an example of a timing chart showing command sequences, temporal changes of a ready/busy signal, and transfers of signals relating to a prefix command and signals relating to another prefix command, which relate to a suspend read operation executed in the semiconductor memory device according to the modification of the second embodiment.

FIG. 23 shows an example of a timing chart showing command sequences, temporal changes of the ready/busy signal R/Bn, and transfers of signals relating to the prefix command "XXh" and signals relating to the prefix command "WWh" in the circuit configuration shown in FIG. 22, which relate to a suspend read operation executed in the semiconductor memory device 1A according the modification of the second embodiment. In FIG. 23, a waveform relating to the data CSOw is shown such that the waveform is at the H level when the command "WWh" is being transmitted by the data CSOw, and at the L level in the other cases.

Regarding the timing chart shown in FIG. 23, points different from the example of FIG. 15 will be described. Before the memory controller 2 transmits the command set CSXW, the signal FSx is also at the L level, although this is omitted in FIG. 15. The signals of the bits of the data CSOw are also at the L level, and the signals CS_Ww, FS_Ww, CS_Rw, FS_Rw, and FSw are also at the L level.

The operation in which the semiconductor memory device 1A receives the command set CSXW and starts the write operation WO is the same as that in the example of FIG. 15. As described with reference to FIG. 15, the signal FSx is output from the multiplexer circuit MUXx at the H level, based on the H-level signal FS_Wx. By receiving the H-level signal FSx while the signal ROS is at the L level, the sequencer 17 starts the write operation WO in a mode designated by the prefix command "XXh".

The operation in which the semiconductor memory device 1A receives, instead of the command set CSXR, a command set CSWR, which is obtained by replacing the prefix command "XXh" of the command set CSXR with the prefix command "WWh", suspends the write operation WO, and starts the read operation RO is an operation in which the processes described with reference to FIG. 15 are modified as follows.

Specifically, the subject of each of the processes is changed from the circuit described in the example of FIG. 15 to a circuit having the same configuration as the circuit or a circuit provided to substitute the circuit included in the second command processing circuit 1532A. In addition, the command "XXh", data CSO, signal CS_R, signal FS_R, and signal FS in the descriptions of the processes are replaced with the command "WWh", data CSOw, signal CS_Rw, signal FS_Rw, and signal FSw, respectively. In accordance with suspension of the write operation wo, the semiconductor memory device 1A brings the signal FSx to the L level. Based on the H-level signal FS_Rw, the signal FSw is output from the multiplexer circuit MUXw at the H level. By receiving the H-level signal FSw while the signal ROS is at the H level, the sequencer 17 starts the read operation RO in a mode designated by the prefix command "WWh".

Here, the AND circuit AND1_Wx is outputting an L-level signal as receiving neither the command "10h" nor the command "15h" via the second input unit when the command register 153A receives the command "WWh". In response to the toggling of the write enable signal WEn, the register circuit CR2_Wx receives and retains the L-level signal output from the AND circuit AND1_Wx, and continues outputting the signal CS_Wx at the same L-level as the retained signal.

The operation after the semiconductor memory device 1A starts the read operation RO is the same as that in the example of FIG. 15 except that the signals CS_Rw and FS_Rw are brought to the L level instead of the signals CS_R and FS_R being brought to the L level, in accordance with completion of the read operation RO. In accordance with the completion of the read operation RO, the semiconductor memory device 1A brings the signal FSw to the L level. In response to the receipt of the command "48h", the semiconductor memory device 1A causes the multiplexer circuit MUXx to output the signal FSx at the H level, based on the H-level signal FS_Wx. By receiving the H-level signal FSx while the signal ROS is at the L level, the sequencer 17 resumes the write operation wo in a mode designated by the prefix command "XXh". In accordance with completion of the resumed write operation WO, the semiconductor memory device 1A brings the signal FSx to the L level.

Described above is an example of the case where the semiconductor memory device 1A accepts, for example, a command set related to an SLC-mode write operation, and then accepts, for example, a command set related to an MLC-mode read operation. However, the semiconductor memory device 1A can perform the same operation when accepting, for example, a command set related to an MLC-mode write operation, and then accepting a command set related to an SLC-mode read operation.

Figure 24:
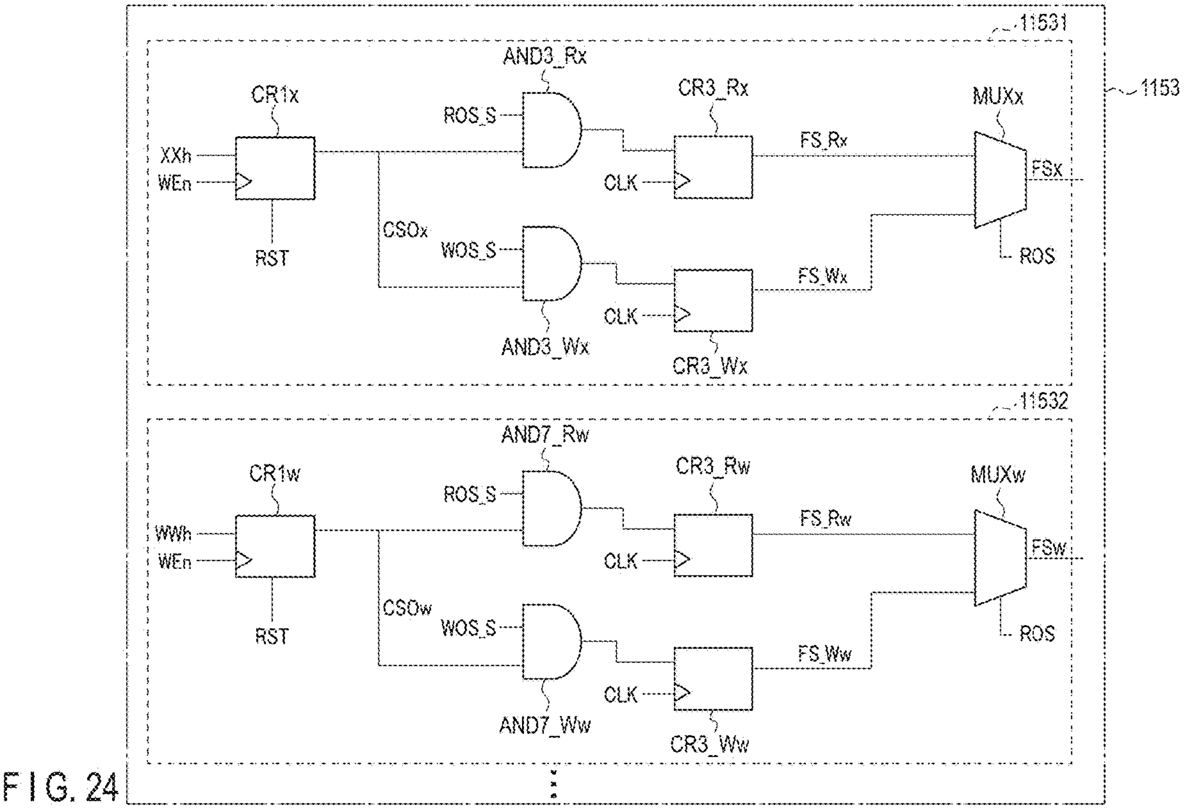
FIG. 24 shows an example of the circuit configuration of a command register of a semiconductor memory device according to a comparative example of the modification of the second embodiment.

FIG. 24 shows an example of the circuit configuration of a command register 1153 of a semiconductor memory device according to a comparative example of the modification of the second embodiment. As an example of the circuit configuration of the command register 1153, an example of the circuit configuration including a portion that receives a prefix command "WWh" and generates a signal FSw based on the command "WWh" in addition to the circuit configuration shown in FIG. 16 is shown.

The command register 1153 shown in FIG. 24 includes a first command processing circuit 11531 and a second command processing circuit 11532.

The first command processing circuit 11531 has the circuit configuration shown in FIG. 16. For distinction from the second command processing circuit 11532, each register circuit, each AND circuit, and a multiplexer circuit included in the circuit configuration, and output data and output signals from these circuits will be accompanied by a suffix x at the end of their reference symbols.

The second command processing circuit 11532 has a circuit configuration obtained by providing the circuit configuration of the first command processing circuit 11531 with AND circuits AND7_Ww and AND7_Rw instead of the AND circuits AND3_Wx and AND3_Rx. Each register circuit, each AND circuit, and a multiplexer circuit included in the circuit configuration, and output data and output signals from these circuits, are accompanied by a suffix w at the end of their reference symbols.

In response to the receipt of the command "WWh" at the command register 1153, the command "WWh" is supplied to the register circuit CR1*w* of the second command processing circuit 11532. In response to the toggling of the write enable signal WEn, the register circuit CR1*w* receives and retains the supplied command "WWh". The register circuit CR1*w* outputs the retained data as data CSOw.

The AND circuit AND7_Ww receives the data CSOw and a signal WOS_S. The AND circuit AND7_Ww outputs an H-level signal on an output terminal when receiving the command "WWh" as the data CSOw and receiving the signal WOS_S at the H level, and outputs an L-level signal on the output terminal in the other cases.

The AND circuit AND7_Rw receives the data CSOw and a signal ROS_S. The AND circuit AND7_Rw outputs an H-level signal on an output terminal when receiving the command "WWh" as the data CSOw and receiving the ROS_S at the H level, and outputs an L-level signal on the output terminal in the other cases.

The register circuit CR3_Ww receives the signal output from the AND circuit AND7_Ww, instead of the signal output from the AND circuit AND3_Wx in the case of the first command processing circuit 11531. The register circuit CR3_Rw receives the signal output from the AND circuit AND7_Rw, instead of the signal output from the AND circuit AND3_Rx in the case of the first command processing circuit 11531.

Other than these points, the circuit configuration of the second command processing circuit 11532 is the same as that of the first command processing circuit 11531.

Figure 25:
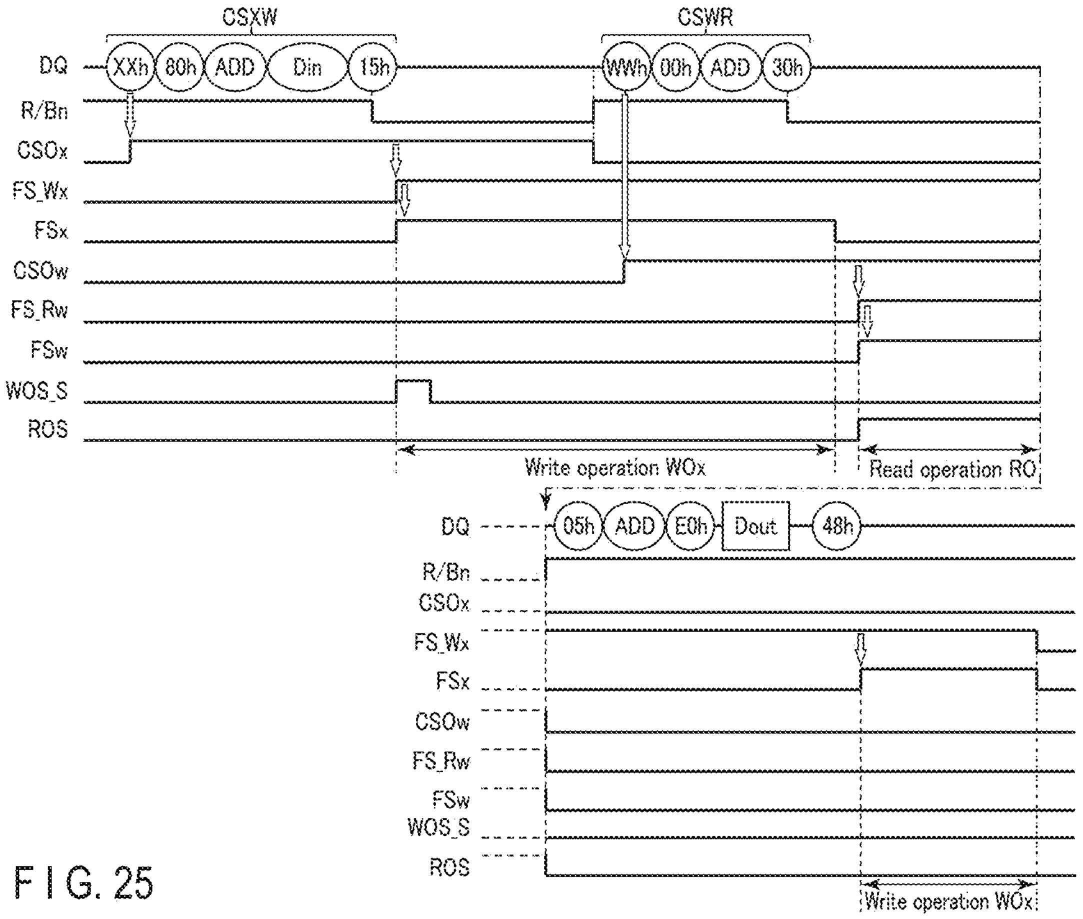
FIG. 25 shows an example of a timing chart showing command sequences, temporal changes of a ready/busy signal, and transfers of signals relating to a prefix command and signals relating to another prefix command, which relate to a suspend read operation executed in the semiconductor memory device according to the comparative example of the modification of the second embodiment.

FIG. 25 shows an example of a timing chart showing command sequences, temporal changes of the ready/busy signal R/Bn, and transfers of signals relating to the prefix command "XXh" and signals relating to the prefix command "WWh" in the circuit configuration shown in FIG. 24, which relate to a suspend read operation executed in the semiconductor memory device according to the comparative example of the modification of the second embodiment. In the timing chart shown in FIG. 25, confirmation by the memory controller using the command "70h" of whether or not the semiconductor memory device has made the latch circuits XDL unoccupied and thereby entered the ready state is omitted for ease of reference.

Regarding the timing chart shown in FIG. 25, points different from the example of FIG. 17 will be mainly described.

The operation in which the semiconductor memory device receives the command set CSXW, starts the write operation WO, and enters the busy state, and then enters the ready state is the same as that in the example of FIG. 17. As in the example of FIG. 17, in response to entering the ready state in this way, the semiconductor memory device resets the register circuit CR1*x*, and brings the signals of the bits of the data retained in the register circuit CR1*x* and those of the data CSOx to the L level. As in the example of FIG. 17, the memory controller waits until the semiconductor memory device enters the ready state in this way, and then transmits a read operation-related command set to the semiconductor memory device.

The operation in which the semiconductor memory device receives a command set CSWR instead of the command set CSXR, suspends the write operation WOx, and starts the read operation RO is an operation in which the processes described with reference to FIG. 17 are modified as follows.

Specifically, the subject of each of the processes is changed from the circuit described in the example of FIG. 17 to a circuit having the same configuration as the circuit or a circuit provided to substitute the circuit included in the second command processing circuit 11532. In addition, the command "XXh", data CSO, signal FS_R, and signal FS in the descriptions on the processes are replaced with the command "WWh", data CSOw, signal FS_Rw, and signal FSw, respectively. Accordingly, the read operation RO is started in a mode designated by the prefix command "WWh".

The operation after the semiconductor memory device starts the read operation RO is the same as that in the example of FIG. 15 except that the signals of the bits of the data CSOw and the signal FS_Rw are brought to the L level instead of the signals of the bits of the data CSO and the signal FS_R being brought to the L level, in accordance with completion of the read operation RO.

Let us consider the case where the memory controller transmits the command set CSWR to the semiconductor memory device without waiting as described above.

In this case, while the register circuit CR1*x* retains the command "XXh" and is outputting the command "XXh" as the data CSOx, the register circuit CR1*w* is supplied with the command "WWh", retains the command "WWh", and outputs the command "WWh" as the data CSOw. For example, when the signals ROS_S and ROS are brought to the H level, and the signal FSw is brought to the H level based on the output command "WWh", the signal FSx may be at the H level based on the command "XXh" output from the register circuit CR1*x*. The semiconductor memory device may recognize that the H-level signal FSx is based on the command set CSWR. Based on such recognition, the semiconductor memory device may execute the read operation RO by the command set CSWR in the mode designated by the command "XXh", not the mode designated by the command "WWh" (hereinafter referred to as a "first malfunction").

Furthermore, in this case, while the signal WOS_S is at the H level for example, the register circuit CR1*w* may retain the command "WWh" and output the command "WWh" as the data CSOw. In this case, while the signal ROS is at the L level, the signal FSx is at the H level based on the command "XXh" output from the register circuit CR1*x*, and the signal FSw may simultaneously be at the H level based on the output command "WWh". The semiconductor memory device may recognize that the H-level signal FSw is based on the already-accepted command set CSXW. Based on such recognition, the semiconductor memory device may execute the write operation WOx by the command set CSXW in the mode designated by the command "WWh", not the mode designated by the command "XXh" (hereinafter referred to as a "second malfunction").

To prevent such a malfunction, the semiconductor memory device according to the comparative example of the modification of the second embodiment causes the memory controller to wait until the semiconductor memory device enters the ready state and resets the register circuit CR1*x* as described above. At the time of the resetting of the register circuit CR1*x*, the signal WOS_S is at the L level. After being notified that the semiconductor memory device has entered the ready state, the memory controller transmits a command set CSWR to the semiconductor memory device. Since the semiconductor memory device accepts the command set CSWR after resetting the register circuit CR1*x* as described above, the first malfunction does not occur. In addition, since the semiconductor memory device accepts the command set CSWR, for example after the signal WOS_S is brought to the L level, the second malfunction does not occur, either.

Upon receipt of the command set CSXW at the semiconductor memory device 1A according to the modification of the second embodiment, a signal relating to the command "XXh" is transmitted to and retained in the register circuit CR2_Wx based on the command "15h" and the write enable signal WEn. After retaining the signal relating to the command "XXh" in the register circuit CR2_Wx, the semiconductor memory device 1A can reset the register circuit CR1*x*. The time when the register circuit CR1*x* can be reset is earlier than the time when the semiconductor memory device 1A resets the register circuit CR1*x* after entering the ready state as described in connection with the comparative example of the modification of the second embodiment. In response to the receipt of the command "15h" in the command set CSXW for example, the semiconductor memory device 1A resets the register circuit CR1*x*. In such a case, the first malfunction does not occur even if the semiconductor memory device 1A accepts the command set CSWR immediately after receiving the command set CSXW.

In addition, in response to, for example, the signal WOS_S being brought from the L level to the H level and the write operation WO being started, the semiconductor memory device 1A according to the modification of the second embodiment brings the signals of the interconnects transmitting the command "10h" and command "15h" to the L level. In such a case, even if the register circuit CR1*w* retains the command "WWh" and outputs the command "WWh" as the data CSOw while the signal WOS_S is at the H level for example, the signal FSw is never brought to the H level based on the output command "WWh" while the signal ROS is at the L level. This is because the AND circuit AND6_Ww outputs an L-level signal only as receiving neither the command "10h" nor the command "15h" via the second input unit. In such a case, the second malfunction does not occur either, even if the semiconductor memory device 1A accepts the command set CSWR immediately after receiving the command set CSXW.

Therefore, the semiconductor memory device 1A according to the modification of the second embodiment may accept the command set CSWR immediately after receiving the command set CSXW. The semiconductor memory device 1A receives the command set CSWR, suspends the write operation WO, and starts the read operation RO. Accordingly, the semiconductor memory device 1A allows the memory controller 2 to transmit a read operation-related command set earlier. In addition, the semiconductor memory device 1A according to the modification of the second embodiment may start a suspend read operation earlier, like the semiconductor memory device 1 according to the first embodiment.

Herein, if expressions such as "the same", "correspond", "constant", "maintain", etc. are used, variations in the range of design may be tolerated.

Herein, the term "couple" refers to electrical coupling, and does not exclude intervention of another component.

The semiconductor memory device according to the first embodiment can execute operations described in the comparative examples of the first embodiment. The semiconductor memory device according to the first embodiment may perform the operations described in the first embodiment in any combination.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
- a first plane including a first memory cell array;
- a second plane different from the first plane, the second plane including a second memory cell array different from the first memory cell array; and
- a control circuit configured to:
  - receive a first command set related to the first plane,
  - output a first signal indicating whether or not the first plane is ready for a read operation in a first time period of executing a first operation on the first plane in response to receipt of the first command set,
  - output a second signal indicating whether or not the first plane is ready for an operation in the first time period, and
  - output a ready/busy signal indicating whether or not the semiconductor memory device is ready for the operation in the first time period,
- wherein the first signal, the second signal, and the ready/busy signal are mutually different.

2. The device of claim 1, wherein the control circuit is further configured to:
- receive a second command set related to status information, and
- output the first signal, the second signal, and a third signal in response to receipt of the second command set.

3. The device of claim 1, wherein the operation is a write operation, a read operation, or an erase operation.

4. The device of claim 1, wherein the second signal indicates a ready state, while the ready/busy signal indicates the ready state.

5. The device of claim 1, wherein the second signal indicates a busy state, while the ready/busy signal indicates the busy state.

6. The device of claim 1, wherein the second signal indicates a ready state, while the ready/busy signal indicates a busy state.

7. The device of claim 1, wherein the second signal indicates a ready state, while the ready/busy signal indicates a busy state when the first time period is overlapped with a second time period of executing a second operation on the second plane in response to a third command set.

8. The device of claim 1, wherein the control circuit is further configured to output a third signal indicating pass or fail of the operation, when the second signal indicates a ready state.

9. The device of claim 1, wherein the control circuit is further configured to:
- receive a fourth command set related to the read operation in the first time period, and
- execute the read operation on the first plane in response to receipt of the fourth command set.

10. The device of claim 9, wherein the control circuit is further configured to receive the fourth command set if the first signal indicates that the first plane is ready for the read operation, even if the second signal indicates that the first plane is busy for the operation.

11. The device of claim 9, wherein the first signal indicates that the first plane is ready for the read operation in a third time period from the receipt of the first command set up to the receipt of the fourth command set.

12. The device of claim 9, wherein the first signal indicates that the first plane is busy for the read operation in a fourth time period from the receipt of the fourth command set to completion of an access to the first memory cell array by the read operation in response to the receipt of the fourth command set.

13. The device of claim 9, wherein the first signal indicates that the first plane is ready for the read operation in a fifth time period from completion of an access to the first memory cell array by the read operation executed in response to the receipt of the fourth command set.

14. The device of claim 9, wherein the control circuit is further configured to suspend the first operation and execute the read operation in response to the receipt of the fourth command set.

15. The device of claim 14, wherein the control circuit is further configured to resume the first operation after completion of executing the read operation in response to the receipt of the fourth command set.

16. The device of claim 14, wherein the control circuit is further configured to resume the first operation in response to receipt of a fifth command set.

17. The device of claim 1, wherein the control circuit is further configured to output the second signal indicating that the first plane is ready for the operation set up to the receipt of the first command set.

18. The device of claim 9, wherein the control circuit is further configured to output the second signal indicating that the first plane is busy for the operation from the receipt of the first command set to completion of an access to the first memory cell array by the read operation executed in response to the receipt of the fourth command set.

19. The device of claim 1, wherein:

the first operation includes a write operation, and the control circuit is configured to execute the write operation on the first memory cell array in response to the receipt of the first command set.

20. The device of claim 1, wherein:

the first operation includes an erase operation, and the control circuit is configured to execute the erase operation on the first memory cell array in response to the receipt of the first command set.

* * * * *